(12) United States Patent
Hirai et al.

(10) Patent No.: US 10,256,100 B2
(45) Date of Patent: Apr. 9, 2019

(54) MANUFACTURING METHOD OF SEMICONDUCTOR DEVICE AND SEMICONDUCTOR DEVICE

(71) Applicant: Renesas Electronics Corporation, Tokyo (JP)

(72) Inventors: Tomohiro Hirai, Ibaraki (JP); Hiroshi Kawaguchi, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 14/969,053

(22) Filed: Dec. 15, 2015

(65) Prior Publication Data

US 2016/0260615 A1 Sep. 8, 2016

(30) Foreign Application Priority Data

Mar. 2, 2015 (JP) ................................ 2015-040075

(51) Int. Cl.
*H01L 21/28* (2006.01)
*H01L 21/306* (2006.01)
(Continued)

(52) U.S. Cl.
CPC .... *H01L 21/28114* (2013.01); *H01L 21/3006* (2013.01); *H01L 21/30604* (2013.01);
(Continued)

(58) Field of Classification Search
None
See application file for complete search history.

(56) References Cited

U.S. PATENT DOCUMENTS

| 8,766,276 B2 * | 7/2014 | Tanaka ............... H01L 29/2003 257/76 |
| 8,829,568 B2 | 9/2014 | Ueno |

(Continued)

FOREIGN PATENT DOCUMENTS

| JP | 2010-109322 A | 5/2010 |
| JP | 2011-249728 A | 12/2011 |
| JP | 2013-258344 A | 12/2013 |
| JP | 2014-236105 A | 12/2014 |

OTHER PUBLICATIONS

Communication dated Jul. 31, 2018 issued by the Japanese Patent Office in counterpart application No. 2015-040075.

*Primary Examiner* — Abul Kalam
(74) *Attorney, Agent, or Firm* — Sughrue Mion, PLLC

(57) ABSTRACT

The present invention makes it possible to improve the characteristic of a semiconductor device using a nitride semiconductor. An electrically-conductive film is formed above a gate electrode above a substrate with an interlayer insulation film interposed and a source electrode coupled to a barrier layer on one side of the gate electrode and a drain electrode coupled to the barrier layer on the other side of the gate electrode are formed by etching the electrically-conductive film. On this occasion, the source electrode is etched so as to have a shape extending beyond above the gate electrode to the side of the drain electrode and having a gap (opening) above the gate electrode. Successively, hydrogen annealing is applied to the substrate. In this way, by forming the gap at a source field plate section of the source electrode, it is possible to efficiently supply hydrogen in the region where a channel is formed in the hydrogen annealing process.

3 Claims, 27 Drawing Sheets

(51) Int. Cl.
*H01L 21/324* (2006.01)
*H01L 21/768* (2006.01)
*H01L 23/535* (2006.01)
*H01L 29/201* (2006.01)
*H01L 29/423* (2006.01)
*H01L 29/66* (2006.01)
*H01L 29/78* (2006.01)
*H01L 29/40* (2006.01)
*H01L 29/778* (2006.01)
*H01L 21/30* (2006.01)
*H01L 29/417* (2006.01)
*H01L 29/20* (2006.01)

(52) U.S. Cl.
CPC ........ *H01L 21/324* (2013.01); *H01L 21/3245* (2013.01); *H01L 21/76897* (2013.01); *H01L 23/535* (2013.01); *H01L 29/201* (2013.01); *H01L 29/402* (2013.01); *H01L 29/4238* (2013.01); *H01L 29/66446* (2013.01); *H01L 29/66462* (2013.01); *H01L 29/7786* (2013.01); *H01L 29/78* (2013.01); *H01L 29/2003* (2013.01); *H01L 29/41758* (2013.01); *H01L 29/4236* (2013.01)

(56) References Cited

U.S. PATENT DOCUMENTS

| | | | |
|---|---|---|---|
| 9,070,661 B2* | 6/2015 | Takewaki | H01L 27/088 |
| 9,484,342 B2* | 11/2016 | Handa | H01L 29/872 |
| 9,508,842 B2* | 11/2016 | Miyake | H01L 29/7783 |
| 9,559,183 B2 | 1/2017 | Inoue et al. | |
| 2009/0206371 A1* | 8/2009 | Oka | H01L 29/4236 |
| | | | 257/201 |
| 2011/0068371 A1* | 3/2011 | Oka | H01L 29/66462 |
| | | | 257/194 |
| 2011/0291203 A1 | 12/2011 | Miyao | |
| 2012/0319165 A1* | 12/2012 | Nakayama | H01L 29/4236 |
| | | | 257/190 |
| 2013/0126893 A1* | 5/2013 | Tanaka | H01L 29/2003 |
| | | | 257/76 |
| 2014/0239311 A1* | 8/2014 | Kawai | H01L 29/66431 |
| | | | 257/76 |
| 2014/0264274 A1* | 9/2014 | Nakayama | H01L 29/66462 |
| | | | 257/20 |
| 2014/0353720 A1* | 12/2014 | Inoue | H01L 29/7827 |
| | | | 257/192 |
| 2015/0061038 A1* | 3/2015 | Takewaki | H01L 27/088 |
| | | | 257/401 |
| 2015/0340344 A1* | 11/2015 | Lin | H01L 25/072 |
| | | | 257/392 |

* cited by examiner

MANUFACTURING METHOD OF SEMICONDUCTOR DEVICE AND SEMICONDUCTOR DEVICE

CROSS-REFERENCE TO RELATED APPLICATIONS

The disclosure of Japanese Patent Application No. 2015-040075 filed on Mar. 2, 2015 including the specification, drawings and abstract is incorporated herein by reference in its entirety.

BACKGROUND

The present invention relates to a manufacturing method of a semiconductor device and a semiconductor device, and is effectively applicable to a semiconductor device using a nitride semiconductor for example.

In recent years, attention is focused on semiconductor devices using chemical compounds of group-III to group-V having band gaps larger than Si. Among those, a semiconductor device that is a power MISFET (Metal Insulator Semiconductor Field Effect Transistor) using gallium nitride and can perform a normally-off operation is being developed.

For example, a nitride-based field-effect transistor having a gate electrode formed over a recess region with an insulation film interposed is being developed.

Meanwhile, the adoption of a field plate technology is studied in order to improve the characteristics of a field-effect transistor. In Patent Literature 1 (Japanese Unexamined Patent Application Publication No. 2013-258344) for example, a technology of reducing a capacitance between a gate electrode and a drain region by forming a field plate section is disclosed. Further, a technology of reducing a capacitance between a gate electrode and a source region by forming a notched section in a field plate section is disclosed.

CITATION LIST

Patent Literature

Patent Literature 1: Japanese Unexamined Patent Application Publication No. 2013-258344

SUMMARY

The present inventors engage in the research and development of such a semiconductor device using a nitride semiconductor as stated above and earnestly study for the improvement of the characteristics of a normally-off type semiconductor device. During the course of the studies, it has been found that there is a room for further improvement on the characteristics of a semiconductor device using a nitride semiconductor.

Other problems and novel features will be obvious from the descriptions and attached drawings in the present specification.

The outline of a representative embodiment in the embodiments disclosed in the present application is briefly explained as follows.

In a manufacturing method of a semiconductor device shown in an embodiment disclosed in the present application, a first electrode is formed by extending an electrically-conductive film above a substrate beyond above a gate electrode and etching the electrically-conductive film into a shape having an opening. Then after the etching, the substrate is subjected to heat treatment in a hydrogen atmosphere.

A semiconductor device shown in an embodiment disclosed in the present application has a first electrode that is formed above a gate electrode with a first insulation film interposed, extends beyond above the gate electrode, and has an opening (gap).

By a manufacturing method of a semiconductor device shown in the representative embodiment disclosed in the present application and shown below, it is possible to manufacture a semiconductor device having good characteristics.

By a semiconductor device shown in the representative embodiment disclosed in the present application and shown below, it is possible to improve the characteristics of the semiconductor device.

DETAILED DESCRIPTION

Figure 1:
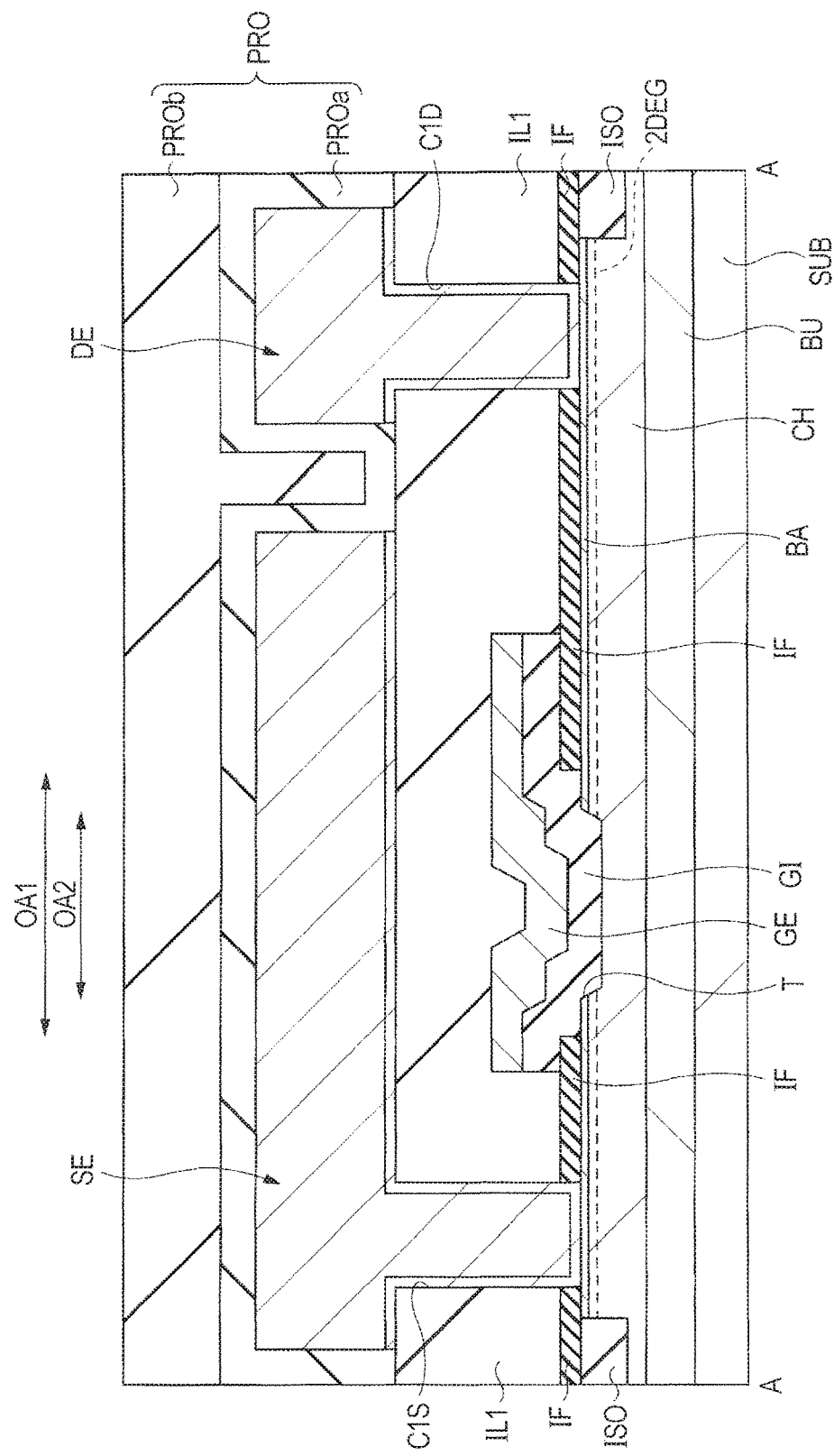
FIG. 1 is a sectional view showing the configuration of a semiconductor device according to Embodiment 1.

In the following embodiments, if necessary for convenience sake, each of the embodiments is explained by dividing it into plural sections or embodiments but, unless otherwise specified, they are not unrelated to each other and are in the relationship of one being a modified example, an application example, a detailed explanation, a supplemental explanation, or the like of a part or the whole of another. Further in the following embodiments, when the number of elements and others (including the number of pieces, a numerical value, a quantity, a range, and others) are referred to, except the cases of being specified and being limited obviously to a specific number in principle and other cases, the number is not limited to a specific number and may be larger or smaller than the specific number.

Further in the following embodiments, the constituent components (including a component step and others) are not necessarily essential except the cases of being specified and being obviously thought to be essential in principle and other cases. Likewise in the following embodiments, when a shape, positional relationship, and the like of a constituent component or the like are referred to, they substantially include those approximate or similar to the shape and the like except the cases of being specified and being obviously thought to be otherwise in principle and other cases. The same goes for the number and others (including the number of pieces, a numerical value, a quantity, a range, and others).

The embodiments are hereunder explained in detail in reference to the drawings. Here, in all the drawings for explaining the embodiments, members having an identical function are represented with an identical or related code and are not explained repeatedly. Further, when a plurality of similar members (sites) exist, an individual or specific site may occasionally be shown by adding a sign to a generic code. Furthermore, in the following embodiments, except when particularly needed, an identical or similar part is not explained repeatedly in principle.

Further, in the drawings used in the embodiments, hatching may sometimes be avoided even in a sectional view in order to make a drawing more visible.

Further, in the sectional views and the plan views, the size of a site may not correspond to an actual device and a specific site may be represented in a relatively enlarged manner in some cases in order to make a drawing easy to understand. Furthermore, even in the case where a sectional view and a plan view correspond to each other, a specific site may be represented in a relatively enlarged manner in some cases in order to make a drawing easy to understand.

Embodiment 1

A semiconductor device according to the present embodiment is hereunder explained in detail in reference to drawings.

[Explanation of Structure]

Figure 2:
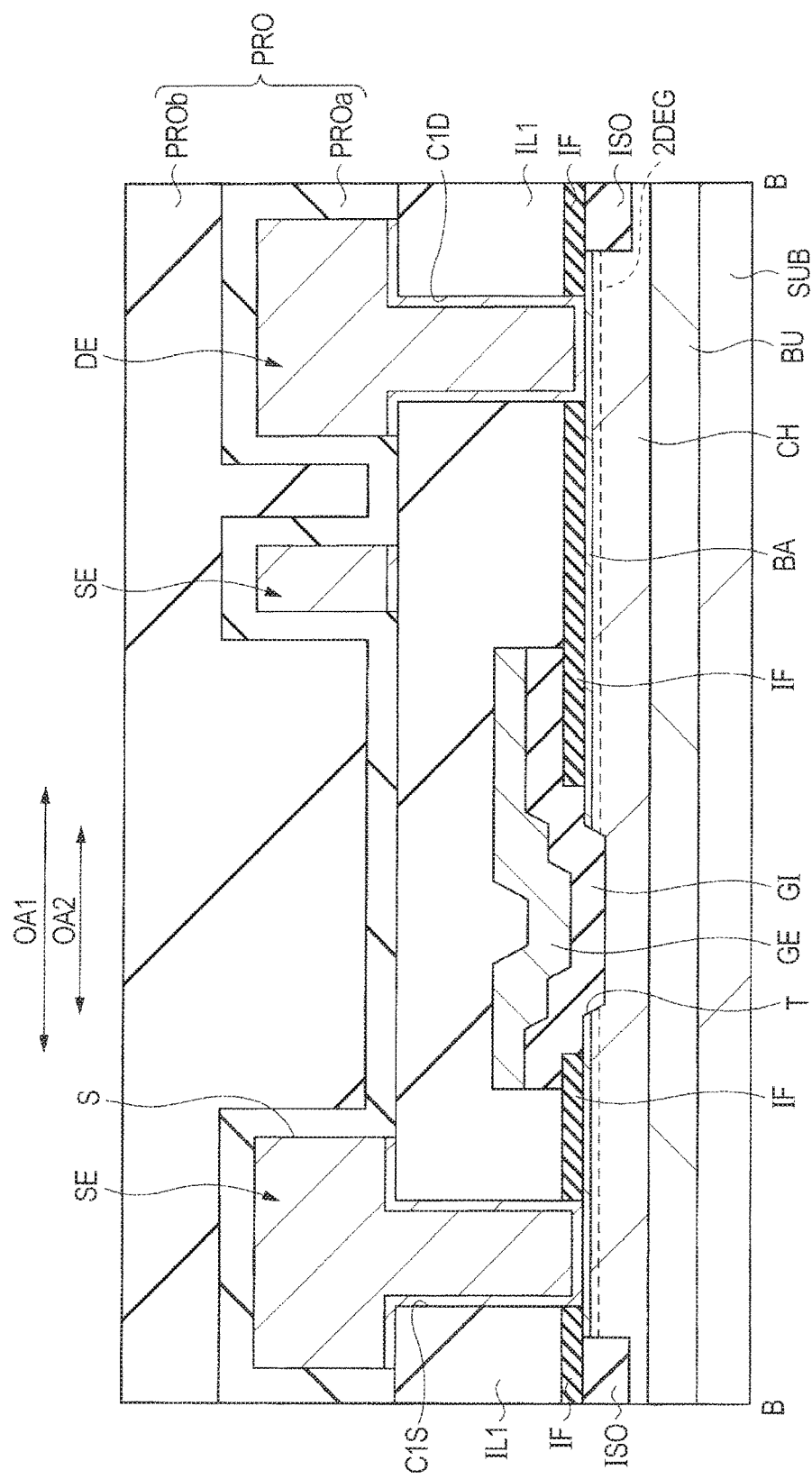
FIG. 2 is a sectional view showing the configuration of a semiconductor device according to Embodiment 1.
Figure 3:
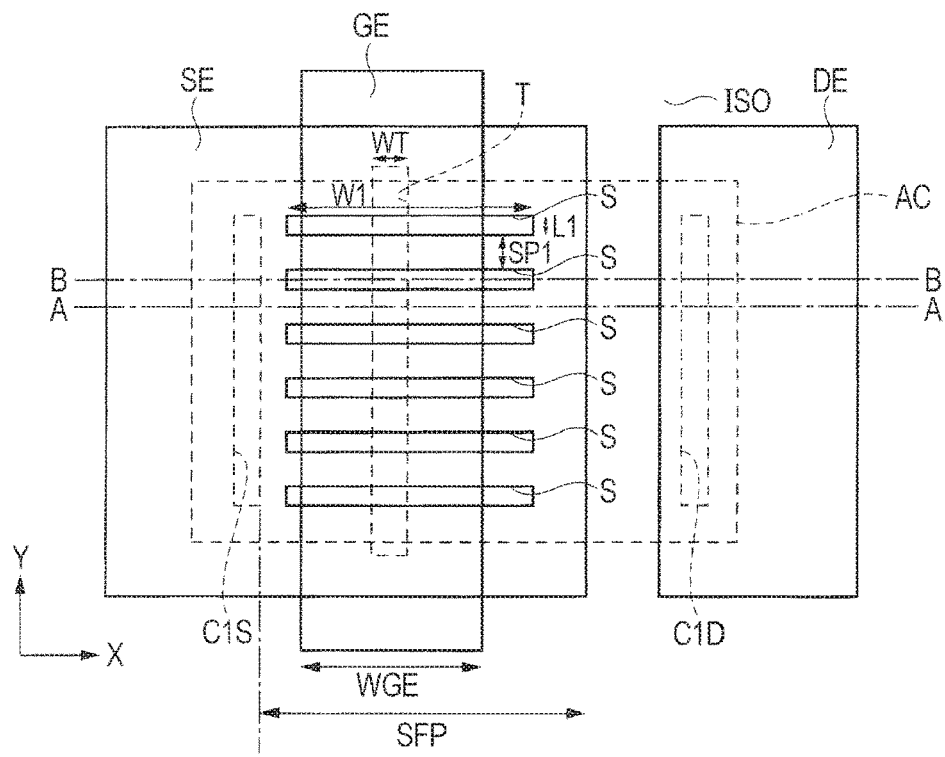
FIG. 3 is a plan view showing the configuration of a semiconductor device according to Embodiment 1.
Figure 4:
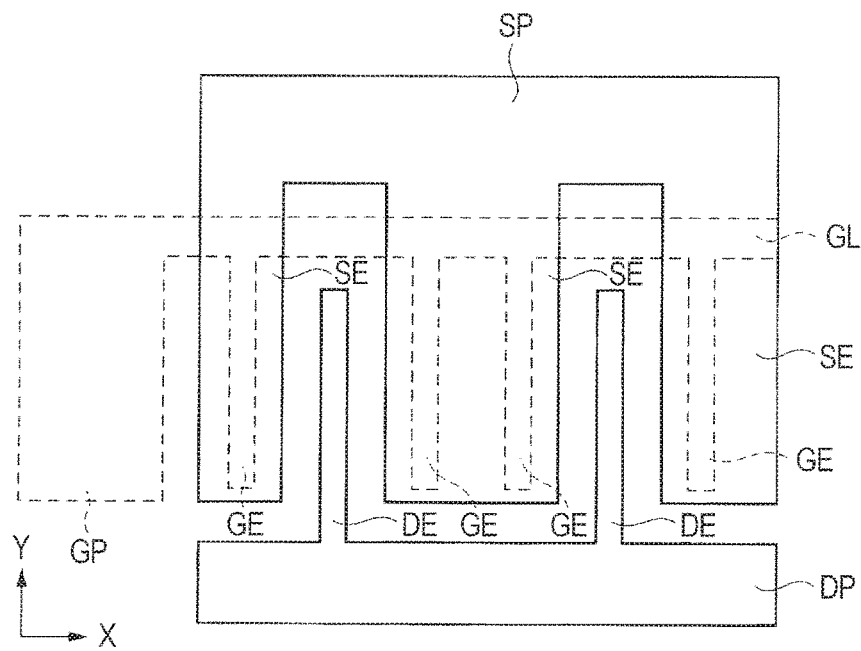
FIG. 4 is a plan view showing the configuration of a semiconductor device according to Embodiment 1.

FIGS. 1 and 2 are sectional views showing the configuration of a semiconductor device according to the present embodiment. FIGS. 3 and 4 are plan views showing the configuration of a semiconductor device according to the present embodiment. FIG. 1 corresponds to the sectional view taken on line A-A of FIG. 3 for example and FIG. 2 corresponds to the sectional view taken on line B-B of FIG. 3 for example.

A semiconductor device (semiconductor element, element) according to the present embodiment is a field-effect transistor (FET) of a MIS (Metal Insulator Semiconductor) type using a nitride semiconductor. The semiconductor device is also called a high electron mobility transistor (HEMT) or a power transistor. The semiconductor device according to the present embodiment is a so-called recess gate type semiconductor device.

In a semiconductor device according to the present embodiment, as shown in FIGS. 1 and 2, a buffer layer BU, a channel layer CH, and a barrier layer BA are formed in sequence over a substrate SUB. Further, an insulation film IF is formed over the barrier layer BA. Here, an active region AC in which a transistor is formed is partitioned by an isolation region ISO (refer to FIG. 3).

A semiconductor device according to the present embodiment has a gate electrode GE formed with a gate insulation film GI interposed and a source electrode SE and a drain electrode DE, those being formed over the barrier layer BA on both the sides of the gate electrode GE, above the channel layer CH.

The gate electrode GE is formed in the interior of a trench T penetrating the insulation film IF and the barrier layer BA and reaching the middle of the channel layer CH with the gate insulation film GI interposed. The channel layer CH and the barrier layer BA comprise nitride semiconductors and the barrier layer BA comprises a nitride semiconductor having an electron affinity smaller than the channel layer CH. In other words, the barrier layer BA comprises a nitride semiconductor having a band gap wider than the channel layer CH.

A two-dimensional electron gas 2DEG is generated on the channel layer CH side in the vicinity of the interface between the channel layer CH and the barrier layer BA.

The two-dimensional electron gas 2DEG is formed through the following mechanism. The nitride semiconductors (gallium nitride based semiconductors here) configuring the channel layer CH and the barrier layer BA have band gaps (forbidden band widths) and electron affinities different from each other. As a result, a square-well potential is generated at the junction plane between the semiconductors. The two-dimensional electron gas 2DEG is generated in the vicinity of the interface between the channel layer CH and the barrier layer BA by accumulating electrons in the square-well potential.

Here, the two-dimensional electron gas 2DEG formed in the vicinity of the interface between the channel layer CH and the barrier layer BA is divided by the trench T in which the gate electrode GE is formed. In a semiconductor device according to the present embodiment therefore, it is possible to: keep an off-state in the state of not applying a threshold potential to the gate electrode GE; and form a channel in the vicinity of the bottom face of the trench T and keep an on-state in the state of applying a threshold potential to the gate electrode GE. It is possible to perform a normally-off operation in this way.

The buffer layer BU comprises a nitride semiconductor having an electron affinity smaller than the channel layer CH. The buffer layer BU is formed in order to raise a threshold potential. That is, a polarization charge (negative fixed charge) is generated on the buffer layer BU side in the vicinity of the interface between the channel layer CH and the buffer layer by forming the buffer layer BU under the channel layer CH and a conduction band rises by the polarization charge. As a result, it is possible to raise a threshold potential on the positive side and improve the normally-off operability.

In the present embodiment here, the source electrode SE extends up to the drain electrode DE side beyond above the gate electrode GE. The region from the position of the source electrode SE corresponding to the end of a contact hole C1S on the gate electrode GE side to the end of the source electrode SE on the drain electrode DE side is called a source field plate section. The source field plate section is a partial region of the source electrode SE (refer to the SFP section in FIG. 3).

The intervals of equipotential lines between the source electrode SE and the drain electrode DE are equalized more in the case of forming the source field plate section in the source electrode SE as stated above than in the case of not forming the source field plate section. In other words, local electric field concentration is mitigated between the source electrode SE and the drain electrode DE. As a result, it is possible to improve the breakdown voltage of a semiconductor device.

In the present embodiment further, since a gap (opening) S is formed at the source field plate section of the source electrode SE, it is possible to efficiently supply hydrogen to a channel forming region at a hydrogen annealing (also referred to as hydrogen alloying) process. By such a hydrogen annealing treatment, it is possible to raise the threshold potential. According to the studies by the present inventors, it is found that the threshold potential can be raised by applying hydrogen annealing (400° C. or higher, 30 min. or longer) at the final stage of the manufacturing process of a semiconductor device for example (refer to FIG. 26). This is presumably because the crystal defects of a nitride semiconductor (GaN or the like for example) are compensated and trap in an insulation film is inactivated by hydrogen.

In the present embodiment furthermore, since a gap (opening) S is formed at the source field plate section of the source electrode SE, it is possible to mitigate the stress added to the substrate SUB and reduce the strain of the substrate SUB.

In the present embodiment yet further, since a gap (opening) S is formed at the source field plate section of the source electrode SE, it is possible to reduce the area where the gate electrode GE and the source electrode SE face each other. As a result, it is possible to reduce the capacitance between the gate electrode GE and the source electrode SE and improve switching characteristics.

The configuration of a semiconductor device according to the present embodiment is explained further in detail. As shown in FIG. 1, in a semiconductor device according to the present embodiment, the buffer layer BU comprising a nitride semiconductor is formed over the substrate SUB, the channel layer CH comprising a nitride semiconductor is formed over the buffer layer BU, and the barrier layer BA comprising a nitride semiconductor is formed over the channel layer CH. Here, a nucleation layer and a strain relaxation layer may be formed from the substrate SUB side between the substrate SUB and the buffer layer BU. Those layers comprise nitride semiconductors. The nucleation layer is formed in order to generate crystal nuclei when a layer formed above such as the strain relaxation layer glows. Further, the nucleation layer is formed in order to prevent elements (Ga or the like for example) configuring the layer formed above from diffusing from the layer formed above into the substrate SUB and the substrate SUB from being altered. Further, the strain relaxation layer is formed in order to mitigate the stress to the substrate SUB and inhibit warps and cracks from being generated in the substrate SUB. The buffer layer BU is formed in order to raise the threshold potential as stated earlier.

The gate electrode GE is formed in the interior of the trench (also referred to as a groove or a recess) T penetrating the insulation film IF and the barrier film BA and being engraved to the middle of the channel layer CH with the gate insulation film GI interposed.

Figure 12:
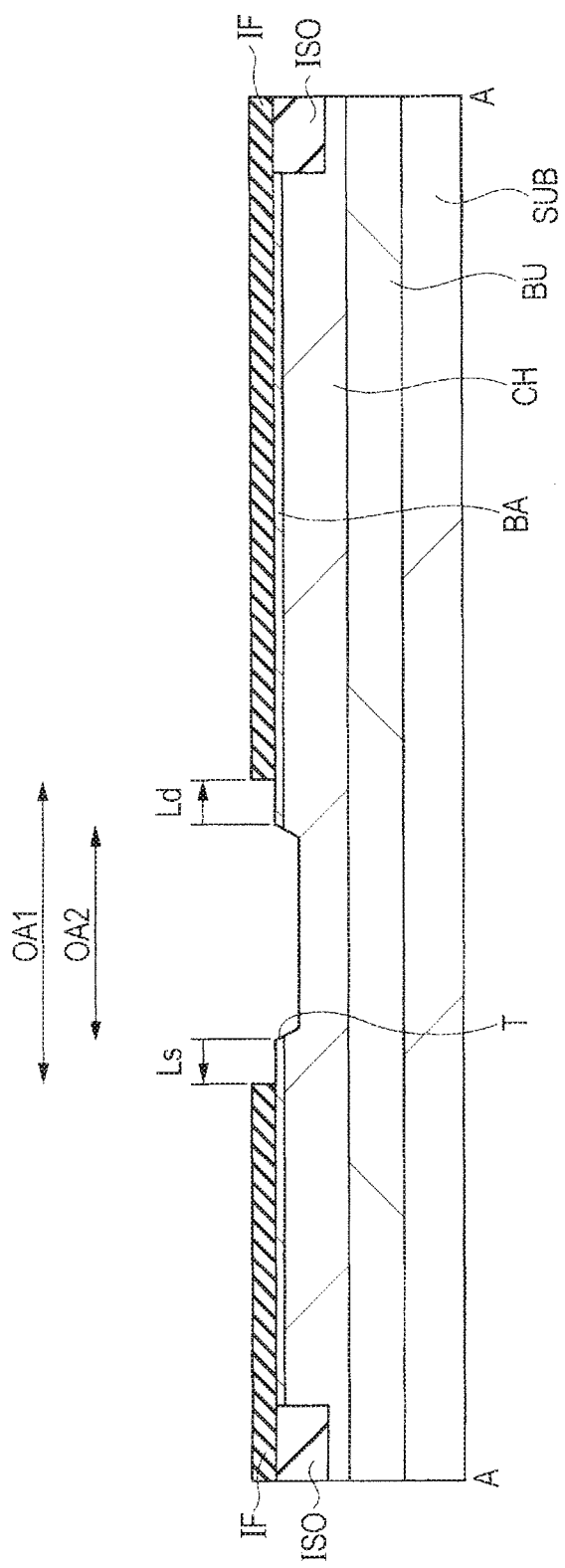
FIG. 12 is a sectional view showing a manufacturing process subsequent to FIG. 11 of a semiconductor device according to Embodiment 1.

Concretely, the insulation film IF has an opening in an opening region OA1 (refer to FIG. 12). The trench T is formed in response to an opening region OA2 that is one size smaller than the opening region OA1. The channel layer CH is exposed through the bottom face of the trench T. The shape of the trench T viewed from the top face (hereunder referred to as a planar shape) is a rectangle having the long sides in the Y direction for example (refer to FIG. 3).

Further, the gate insulation film GI is formed in the trench T and over the insulation film IF. In other words, the gate insulation film GI is formed over the region where the trench T is formed and is formed up to over the insulation film IF on both the sides of the trench T.

The gate electrode GE is formed over the gate insulation film GI. The planar shape of the gate electrode GE is a rectangle having the long sides in the Y direction for example (refer to FIG. 3). Further, the planar shape of the gate electrode GE is one size larger than the planar shape (a rectangle having the long sides in the Y direction) of the trench T for example. In addition, the gate insulation film GI and the gate electrode GE have the same planar shape here.

The gate electrode GE has a shape overhanging in a direction (to the right, to the drain electrode DE side in FIG.

1). The overhanging section is called a field plate electrode. The field plate electrode is a partial region of the gate electrode GE extending from the end of the trench T on the drain electrode DE side to the drain electrode DE side.

Further, the gate electrode GE extends also from the end of the trench T on the source electrode SE side to the source electrode SE side. Then the insulation film IF is arranged under the gate electrode section overhanging (extending) to the drain electrode DE side or the source electrode SE side. The gate electrode GE is covered with an interlayer insulation film IL1.

Further, the source electrode SE and the drain electrode DE are formed over the barrier layer BA on both the sides of the gate electrode GE. The barrier layer BA and the source electrode SE are coupled by ohmic contact with an ohmic layer interposed. Further, the barrier layer BA and the drain electrode DE are coupled by ohmic contact with the ohmic layer interposed. The source electrode SE comprises a junction located in a contact hole C1S formed in the interlayer insulation film IL1 and a wiring section over the junction. Further, the drain electrode DE comprises a junction located in a contact hole C1D formed in the interlayer insulation film IL1 and a wiring section over the junction.

The planar shape of the source electrode SE is a rectangle for example (refer to FIGS. 3 and 4). The source electrode SE has a source field plate section extending to the drain electrode DE side beyond above the gate electrode GE (refer to the SFP section in FIG. 3). Then the source field plate section has gaps (openings) S. The width W1 of each of the gaps S in the X direction is larger than the width WT of the trench T in the X direction. Further, the width W1 is larger than the width WGE of the gate electrode GE in the X direction. The distance (pitch) SP1 between the gaps S may be either the same level as the length L1 of each of the gaps (openings) S in the Y direction or larger than the length L1 for example.

The planar shape of the drain electrode DE is a rectangle for example (refer to FIGS. 3 and 4). The source electrode SE and the drain electrode DE are covered with a protective insulation film PRO. The protective insulation film PRO comprises a laminated film of a lower layer film (PROa) and an upper layer film (PROb).

With regard to the layout of the gate electrode GE, the source electrode SE, and the drain electrode DE, the electrodes are arranged as shown in FIG. 4 for example. The gate electrode GE, the source electrode SE, and the drain electrode DE are arranged over a rectangular active region AC having the long sides in the X direction. The active region AC is surrounded and partitioned by the isolation region ISO (refer to FIG. 3).

The source electrode SE and the drain electrode DE are rectangles having the long sides in the Y direction for example. The source electrode SE and the drain electrode DE are arranged alternately in line in the X direction. Then two gate electrodes GE are arranged between the drain electrodes DE. In other words, two gate electrodes GE are arranged below the source electrode SE. The gate electrode GE is covered with the source electrode SE in this way. Here, the gaps S are not shown in FIG. 4.

Further, the multiple drain electrodes DE are coupled through a drain pad (also referred to as a terminal section) DP. The drain pad DP is arranged so as to extend in the X direction on an end side of the drain electrodes DE (on the lower side in FIG. 4). In other words, the multiple drain electrodes DE are arranged so as to protrude in the Y direction from the drain pad DP extending in the X direction.

The multiple source electrodes SE are coupled through a source pad (also referred to as a terminal section) SP. The source pad SP is arranged so as to extend in the X direction on the other end side of the source electrodes SE (on the upper side in FIG. 4). In other words, the multiple source electrodes SE are arranged so as to protrude in the Y direction from the source pad SP extending in the X direction.

The multiple gate electrodes GE are coupled through a gate line GL. The gate line GL is arranged so as to extend in the X direction on an end side (on the upper side in FIG. 4) of the gate electrodes GE. In other words, the multiple gate electrodes GE are arranged so as to protrude in the Y direction from the gate line GL extending in the X direction. Here, the gate line GL is coupled to a gate pad GP formed on an end side (on the left side in FIG. 4) of the gate line GL in the X direction for example. The layout shown in FIG. 4 is an example and the arranged locations of the drain pad DP, the source pad SP, and the gate pad GP may be changed arbitrarily for example. Further, the drain pad DP, the source pad SP, and the gate pad GP may be formed in layers different from the drain electrodes DE and the source electrodes SE.

[Explanation of Manufacturing Method]

The manufacturing method of a semiconductor device according to the present embodiment is hereunder explained in reference to FIGS. 5 to 25 and the configuration of the semiconductor device is clarified further. FIGS. 5 to 25 are sectional views showing the manufacturing processes of a semiconductor device according to the present embodiment.

Figure 5:
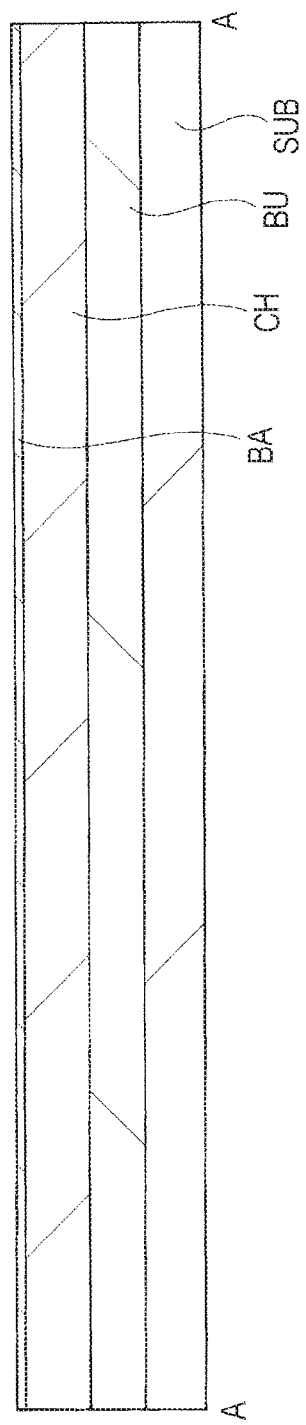
FIG. 5 is a sectional view showing a manufacturing process of a semiconductor device according to Embodiment 1.

As shown in FIG. 5, a buffer layer BU is formed over a substrate SUB. For example, a semiconductor substrate comprising silicon (Si) having a resistivity of 1 Ω·cm and exposing the (111) plane is used as the substrate SUB and an AlGaN layer is grown heteroepitaxially over the substrate SUB as the buffer layer BU by a metal organic chemical vapor deposition (MOCVD) method or the like. The metal organic chemical vapor deposition method is also called a metal organic vapor phase epitaxy (MOVPE) method.

Successively, a gallium nitride (GaN) layer is grown heteroepitaxially as a channel layer CH over the buffer layer BU by a metal organic chemical vapor deposition method or the like. The film thickness of the channel layer CH is about 40 nm for example.

Here, as the substrate SUB, besides the silicon stated above, a substrate comprising SiC, sapphire, or the like may also be used. Otherwise, a bulk substrate of a nitride semiconductor (bulk substrate of GaN for example) may also be used. Further, a nucleation layer and a strain relaxation layer may also be formed from the substrate SUB side between the substrate SUB and the buffer layer BU. For example, a superlattice structure formed by repeatedly stacking an aluminum nitride (AlN) layer as the nucleation layer and a laminated layer (AlN/GaN film) of a gallium nitride (GaN) layer and an aluminum nitride (AlN) layer as the strain relaxation layer or the like is used. Those layers can be formed by a metal organic chemical vapor deposition method or the like.

Successively, an AlGaN ($Al_xGa_{(1-x)}N$) layer is grown heteroepitaxially as a barrier layer BA over the channel layer CH by a metal organic chemical vapor deposition method or the like for example. The film thickness of the AlGaN layer is about 15 to 25 nm for example. Further, the composition of Al is about 20% for example.

In this way, a laminated body of the buffer layer BU, the channel layer CH, and the barrier layer BA is formed. The laminated body is formed by the heteroepitaxial growth, namely by III group plane growth of stacking in the [0001] crystal axis (C-axis) direction. In other words, the laminated body is formed by (0001) Ga plane growth. In the laminated body, a two-dimensional electron gas (2DEG) is generated in the vicinity of the interface between the channel layer CH and the barrier layer BA (refer to FIGS. 1 and 2).

Figure 6:
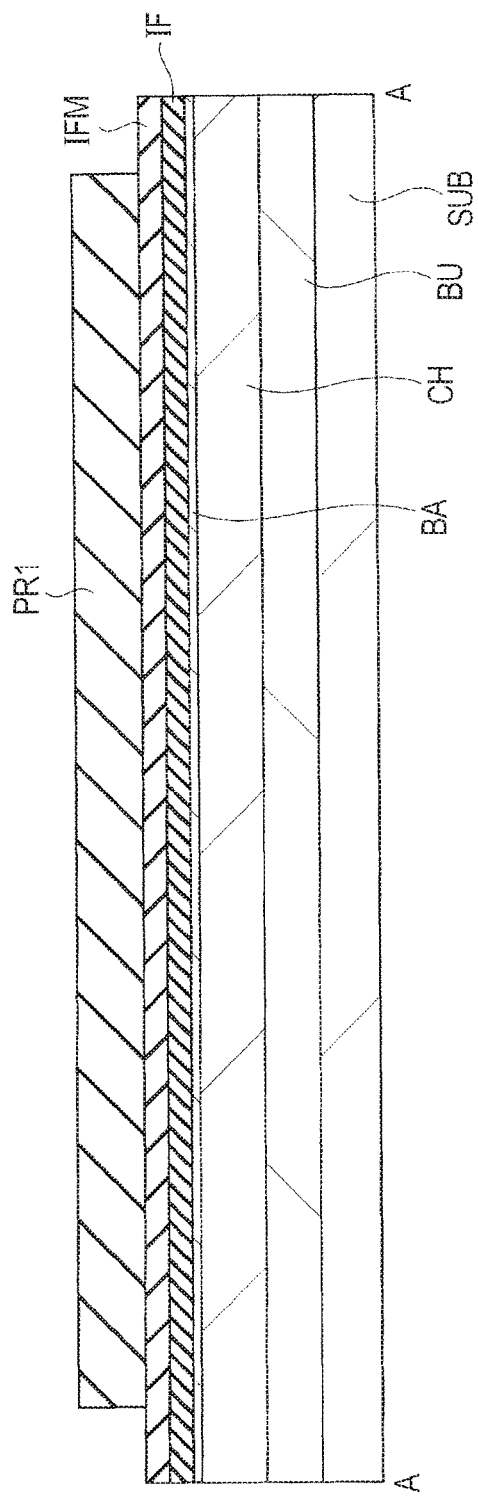
FIG. 6 is a sectional view showing a manufacturing process subsequent to FIG. 5 of a semiconductor device according to Embodiment 1.

Successively, as shown in FIG. 6, an insulation film IF is formed as a cover film over the barrier layer BA. For example, a silicon nitride film (SiN film) is deposited as the insulation film IF over the barrier layer BA by a CVD (Chemical Vapor Deposition) method or the like. The film thickness of the insulation film IF is about 90 nm for example. Successively, for example a silicon oxide film or the like is formed as an insulation film IFM over the insulation film IF by a CVD method.

Figure 7:
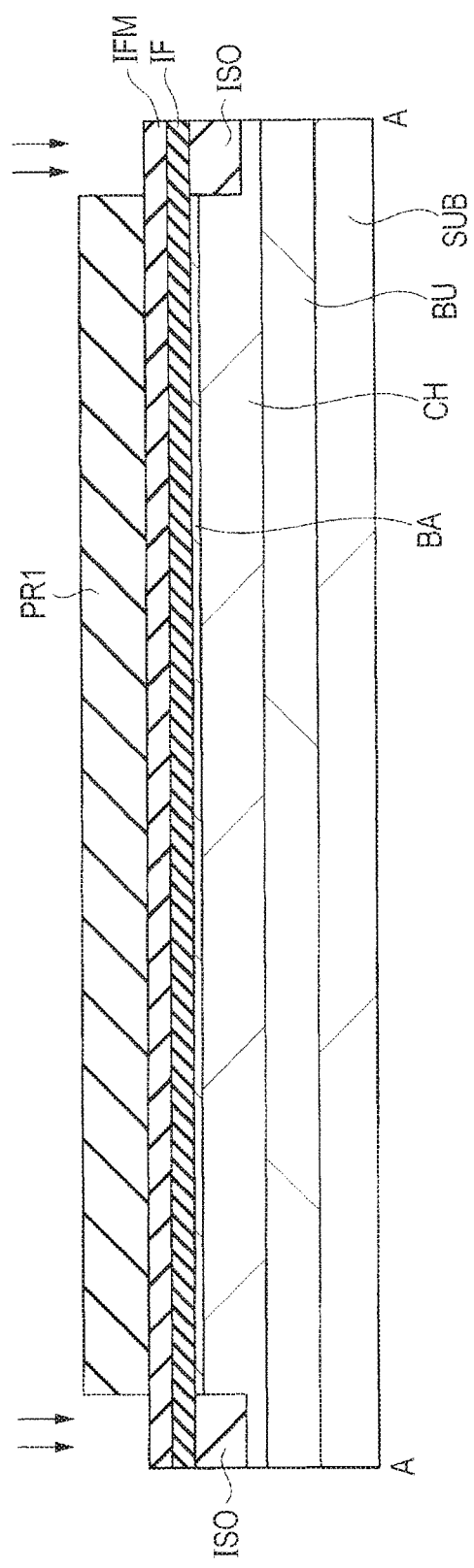
FIG. 7 is a sectional view showing a manufacturing process subsequent to FIG. 6 of a semiconductor device according to Embodiment 1.

Successively, a photoresist film PR1 opening an isolation region is formed over the insulation film IFM by a photolithography technology. Successively, as shown in FIG. 7, boron (B) or nitrogen (N) is injected with the photoresist film PR1 used as a mask. Boron (B) or nitrogen (N) is injected into the channel layer CH and the barrier layer BA through the insulation film IF. In this way, by injecting the ion species such as boron (B) or nitrogen (N) into the channel layer CH and the barrier layer BA, the crystal state changes and a higher resistance is obtained. An isolation region ISO is formed in this way. Successively, the photoresist film PR1 is removed. The region surrounded by the isolation region ISO comes to be an active region AC (refer to FIG. 3).

Figure 8:
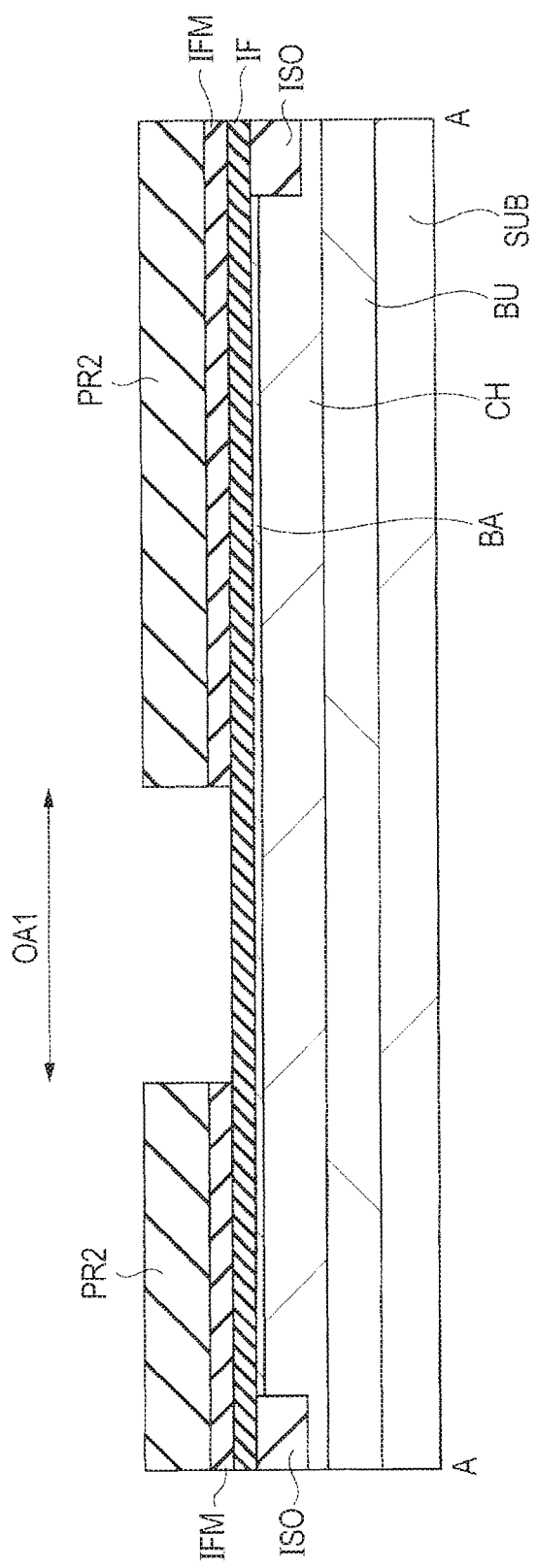
FIG. 8 is a sectional view showing a manufacturing process subsequent to FIG. 7 of a semiconductor device according to Embodiment 1.

Successively, as shown in FIG. 8, a photoresist film PR2 having an opening in an opening region OA1 is formed over the insulation film IFM for a mask by a photolithography technology. Successively, the insulation film IFM is etched with the photoresist film PR2 used as a mask. The insulation film IFM having the opening in the opening region OA1 is thereby formed over the insulation film IF. Successively, the photoresist film PR2 is removed.

Figure 9:
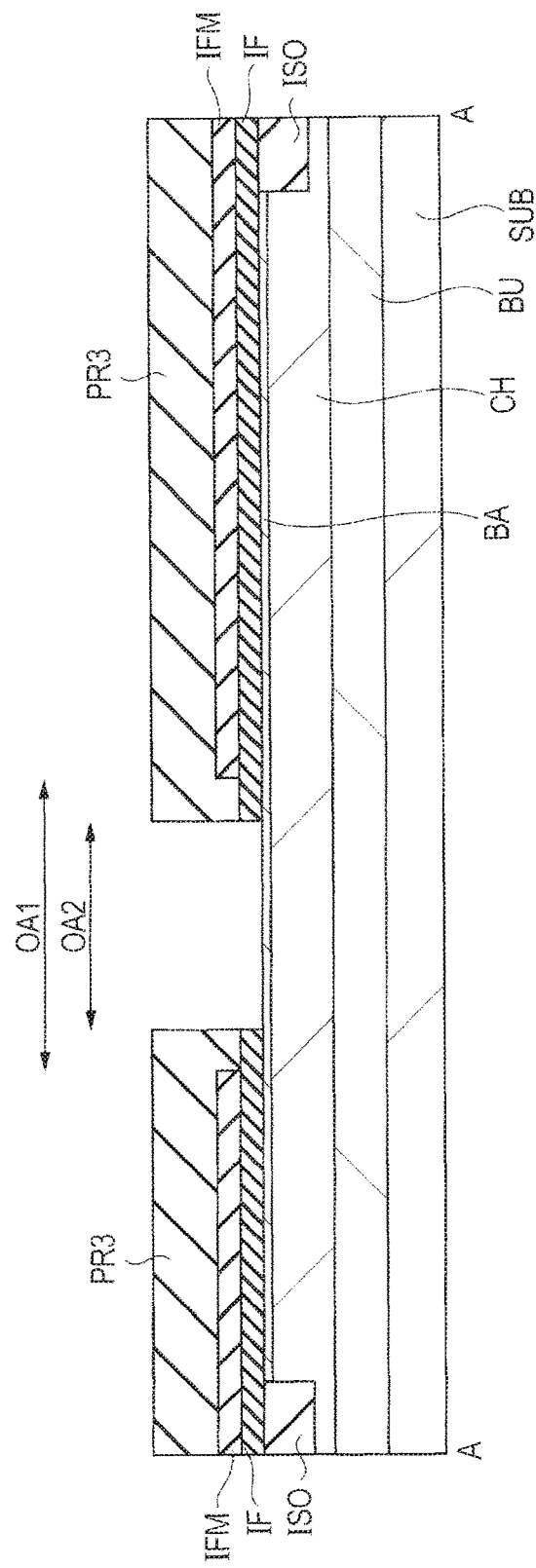
FIG. 9 is a sectional view showing a manufacturing process subsequent to FIG. 8 of a semiconductor device according to Embodiment 1.
Figure 10:
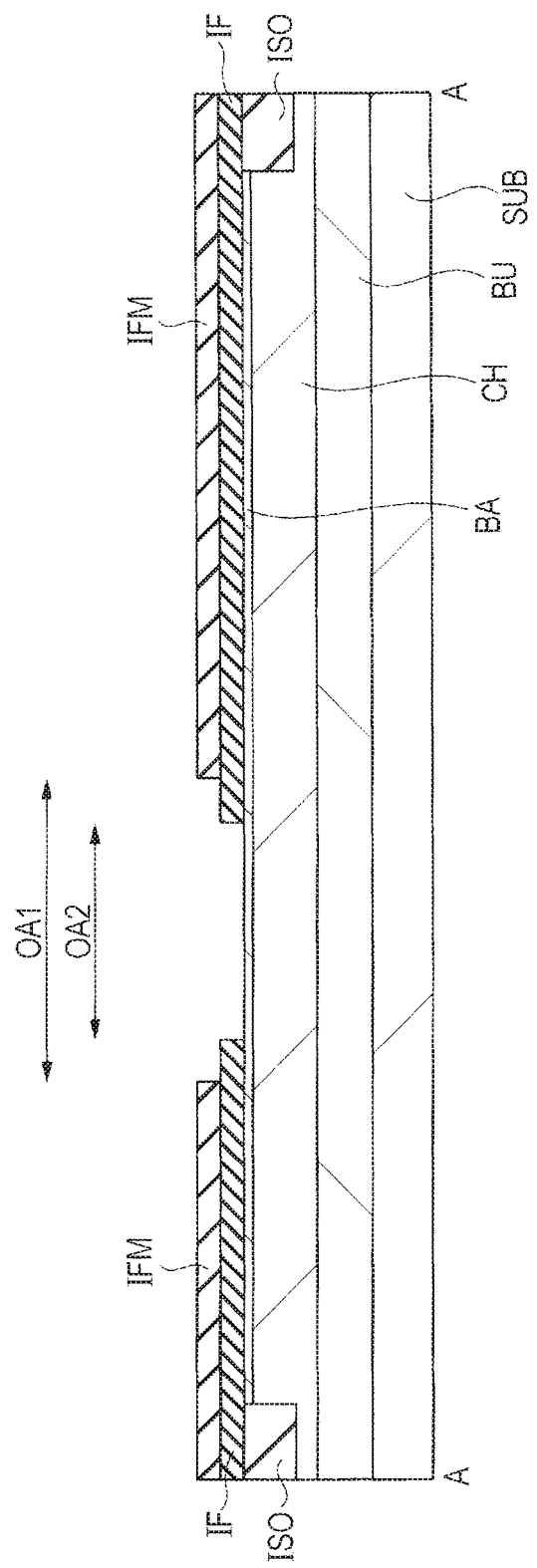
FIG. 10 is a sectional view showing a manufacturing process subsequent to FIG. 9 of a semiconductor device according to Embodiment 1.

Successively, as shown in FIG. 9, a photoresist film PR3 having an opening in an opening region OA2 located inside the opening region OA1 is formed by a photolithography technology. Successively, the insulation film IF is etched with the photoresist film PR3 used as a mask. Successively, the photoresist film PR3 is removed. The insulation film IF having the opening in the opening region OA2 is thereby formed over the barrier layer BA. Further, over the insulation film IF, the insulation film IFM retracting from an end of the opening region OA2 and having the opening in the opening region OA1 is arranged over the insulation film IF (FIG. 10).

Figure 11:
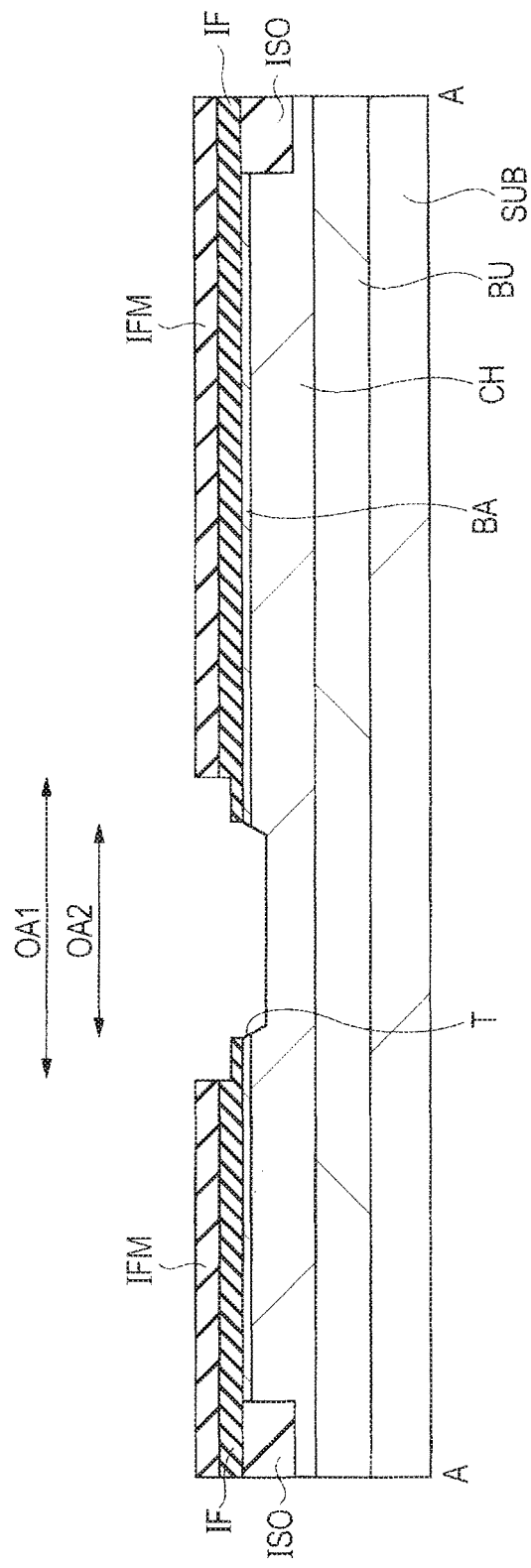
FIG. 11 is a sectional view showing a manufacturing process subsequent to FIG. 10 of a semiconductor device according to Embodiment 1.

Successively, as shown in FIG. 11, a trench T penetrating the insulation film IF and the barrier layer BA and reaching the middle of the channel layer CH is formed by etching the barrier layer BA and the channel layer CH with the laminated film of the insulation film IF and the insulation film IFM used as a mask. In the opening region OA2, etching is applied from the surface of the barrier layer BA to the depth of 25 to 35 nm in order to remove a two-dimensional electron gas (2DEG). In other words, the difference in height between the surface of the barrier layer BA and the bottom face of the trench T is about 25 to 35 nm. The side face of the trench T may take a tapered shape.

Successively, the insulation film IF is etched with the insulation film IFM used as a mask. In other words, the insulation film IF around the trench T is etched. Successively, the insulation film IFM is removed by etching.

In this way, as shown in FIG. 12, the ends of the insulation film IF on the trench T side retract by a distance Ld in a direction (to the right side in FIG. 12) and retract by a distance Ls in the other direction (to the left side in FIG. 12). Then the channel layer CH is exposed from the bottom face of the trench T in the opening region OA2 and the surface of the barrier layer BA is exposed in the region (retracting section) around the opening region OA2 in the opening region OA1. In this way, by retracting the ends of the insulation film IF on the trench T side, gate modulation comes to be more effective. Further, electric field concentration is mitigated and gate breakdown voltage improves.

Figure 13:
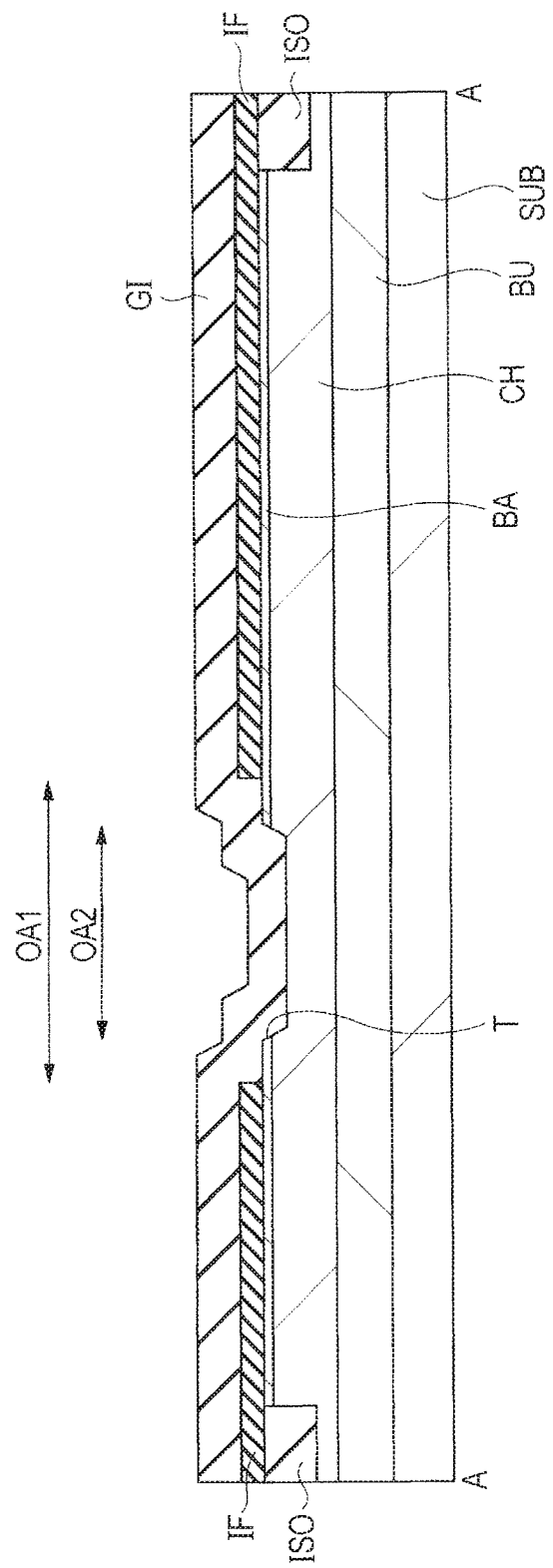
FIG. 13 is a sectional view showing a manufacturing process subsequent to FIG. 12 of a semiconductor device according to Embodiment 1.

Successively, as shown in FIG. 13, a gate insulation film GI is formed in the trench T and over the insulation film IF. For example, an aluminum oxide film (alumina, $Al_2O_3$) having a film thickness of about 50 to 100 nm is deposited as the gate insulation film GI in the trench T and over the insulation film IF by an ALD (Atomic Layer Deposition) method or the like. As the gate insulation film GI, besides the aluminum oxide film, a silicon oxide film or a silicon nitride film may be used for example. Otherwise, a high-permittivity film having a permittivity higher than a silicon oxide film may be used. As the high-permittivity film, a hafnium-base insulation film such as a hafnium oxide film ($HfO_2$ film), a hafnium aluminate film, an HfON film (hafnium oxynitride film), an HfSiO film (hafnium silicate film), an HfSiON film (hafnium silicon oxynitride film), or an HfAlO film may be used. In many cases, the film thickness of the gate insulation film GI is larger than the depth of the trench T.

Figure 14:
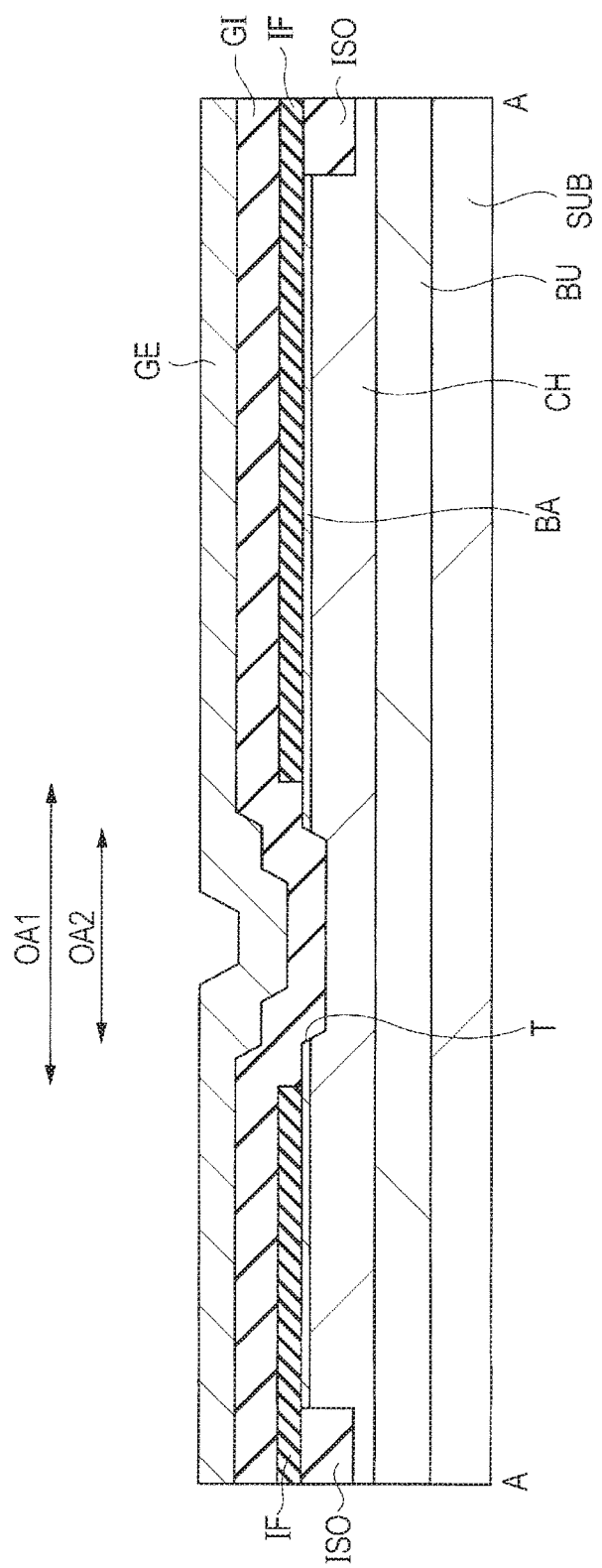
FIG. 14 is a sectional view showing a manufacturing process subsequent to FIG. 13 of a semiconductor device according to Embodiment 1.

Successively, as shown in FIG. 14, an electrically-conductive film that is to be a gate electrode GE is formed over the gate insulation film GI. For example, a TiN film having a film thickness of about 100 nm is deposited as the electrically-conductive film over the gate insulation film GI by a sputtering method or the like. Here, as the electrically-conductive film, a laminated film (also referred to as an Au/Ni film) comprising a nickel (Ni) film and a gold (Au) film above the nickel film may be used.

Figure 15:
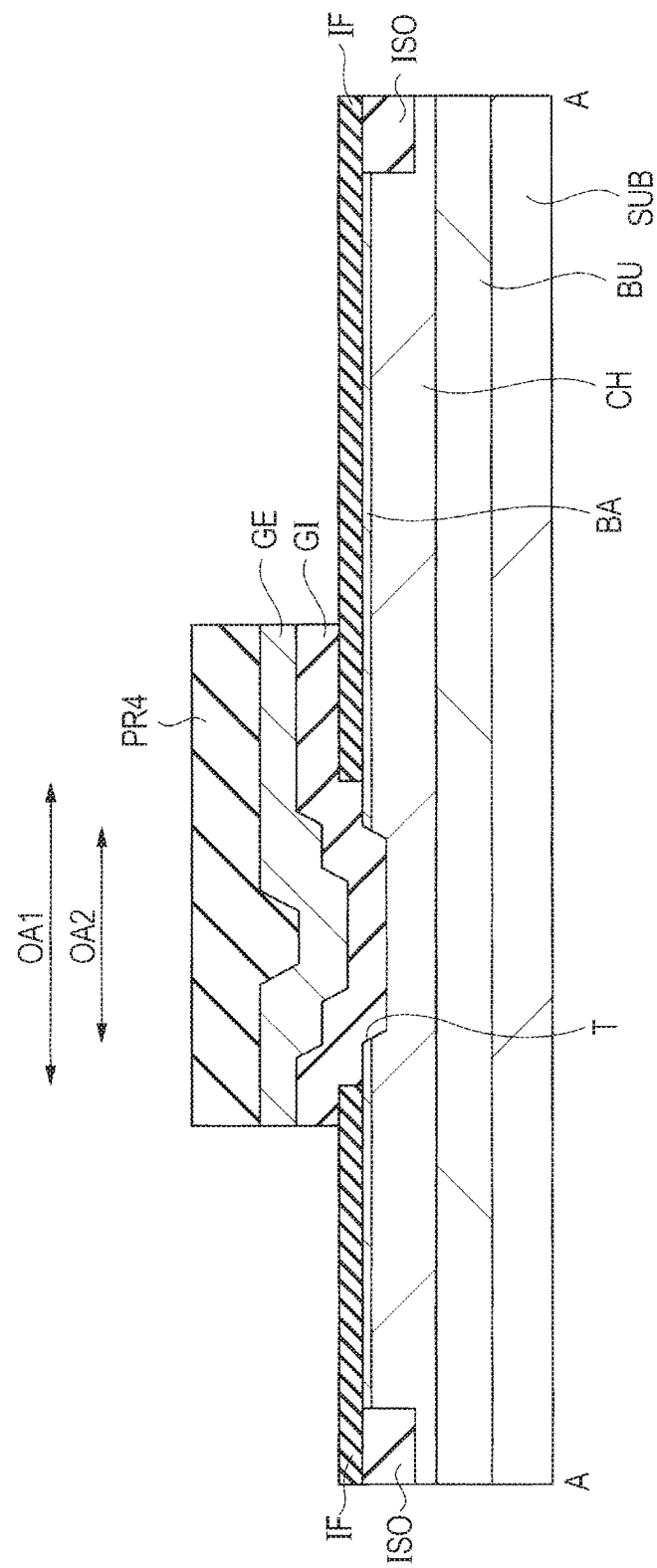
FIG. 15 is a sectional view showing a manufacturing process subsequent to FIG. 14 of a semiconductor device according to Embodiment 1.
Figure 16:
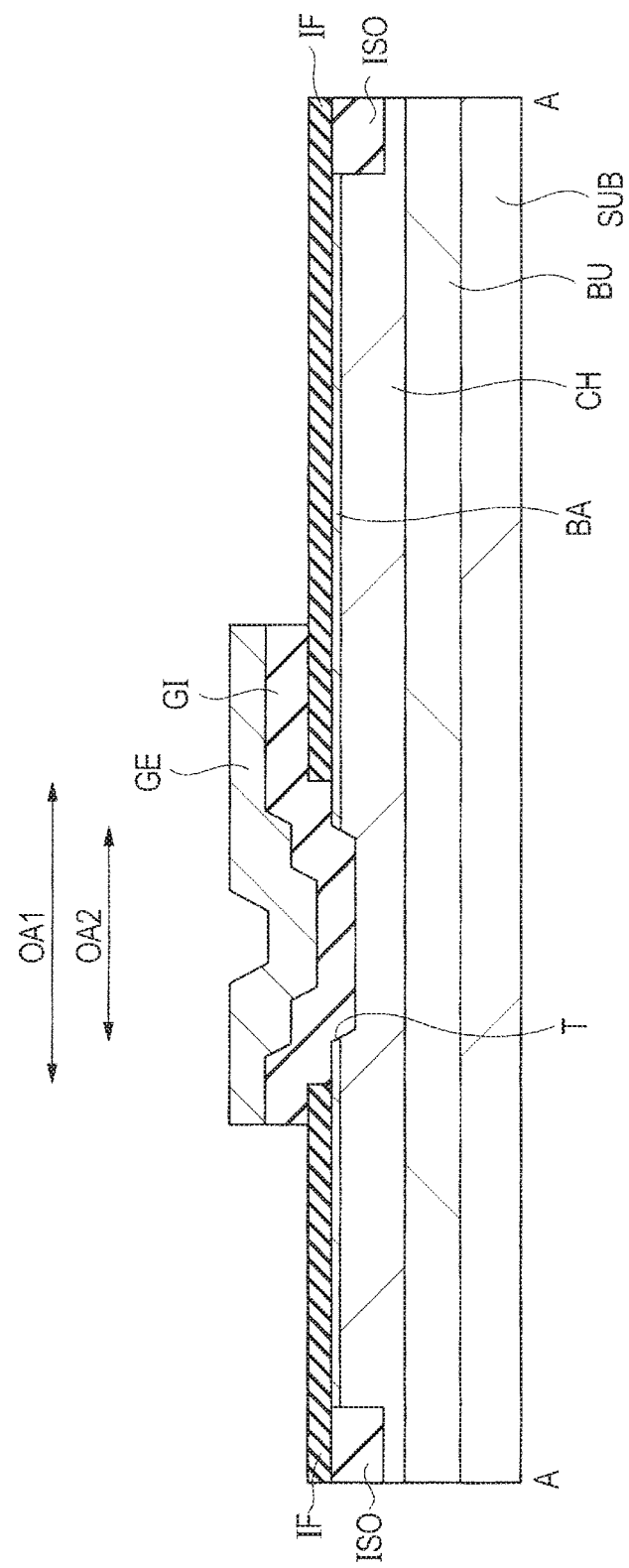
FIG. 16 is a sectional view showing a manufacturing process subsequent to FIG. 15 of a semiconductor device according to Embodiment 1.

Successively, as shown in FIG. 15, the gate electrode GE is formed by patterning the gate electrode GE and the gate insulation film GI by a photolithography technology and an etching technology. For example, a photoresist film PR4 to cover the region where the gate electrode GE is formed is formed by a photolithography technology and the gate electrode GE and the gate insulation film GI are etched with the photoresist film PR4 used as a mask. Successively, the photoresist film PR4 is removed (FIG. 16). Here, during the etching, the insulation film IF plays the role of an etching stopper. Further, during the patterning of the gate electrode GE, the gate electrode GE is patterned into a shape overhanging in a direction (to the right side in FIG. 16, to the drain electrode DE side). In other words, patterning is applied so as to form a field plate electrode as a part of the gate electrode GE. The field plate electrode is a partial region of the gate electrode GE and refers to an electrode part extending from the end of the trench T on the drain electrode DE side to the drain electrode DE side. Here, the gate electrode GE overhangs also in the other direction (to the left side in FIG. 16, to the source electrode SE side). Note that the overhanging amount on the drain electrode DE side is larger than that on the source electrode SE side.

Figure 17:
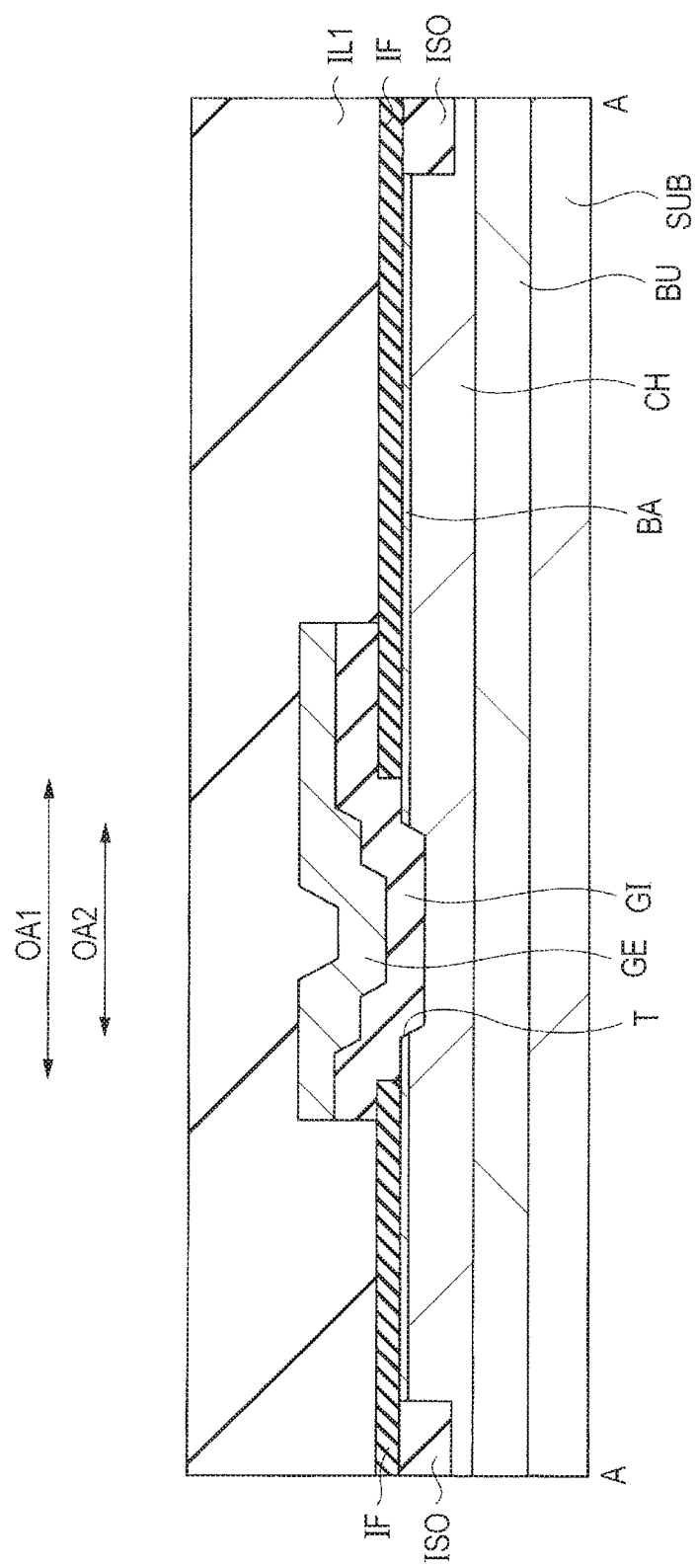
FIG. 17 is a sectional view showing a manufacturing process subsequent to FIG. 16 of a semiconductor device according to Embodiment 1.

Successively, as shown in FIG. 17, a silicon oxide film having a film thickness of about 1,000 nm is deposited as an interlayer insulation film IL1 over the gate electrode GE and the insulation film IF by a CVD method or the like for example. As a result, the interlayer insulation film IL1 comprising the silicon oxide film can be formed.

Figure 18:
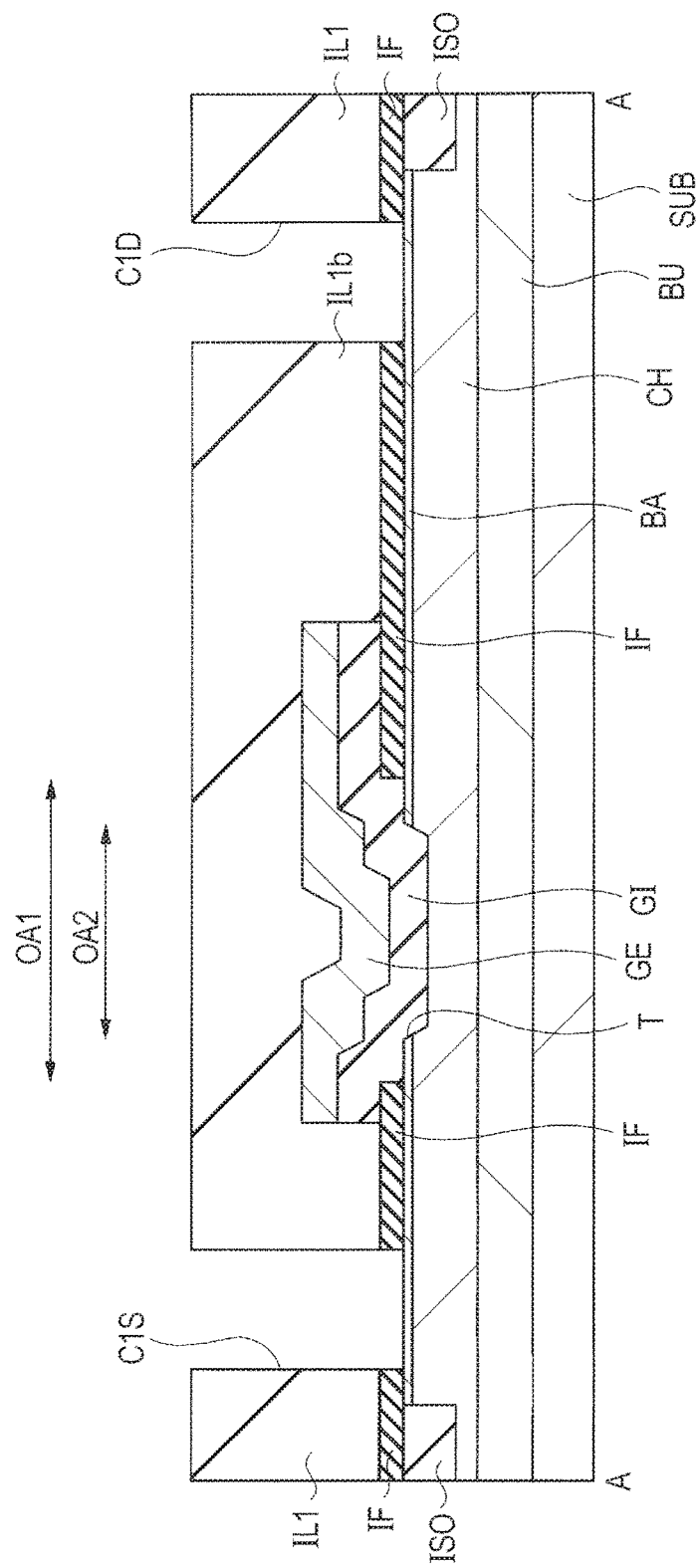
FIG. 18 is a sectional view showing a manufacturing process subsequent to FIG. 17 of a semiconductor device according to Embodiment 1.

Successively, contact holes C1S and C1D are formed in the interlayer insulation film IL1 by a photolithography technology and an etching technology. For example, as shown in FIG. 18, the interlayer insulation film IL1 and the insulation film IF under the interlayer insulation film IL1 are etched with a photoresist film (not shown in the figure) having openings in the regions where the contact holes C1S and C1D are formed used as a mask. The contact holes C1S and C1D are thereby formed. Successively, the photoresist film is removed. As a result, the barrier layer BA is exposed from the bottom sections of the contact holes C1S and C1D (FIG. 18). In this way, the contact holes C1S and C1D are arranged over the barrier layer BA on both the sides of the gate electrode GE respectively.

Figure 19:
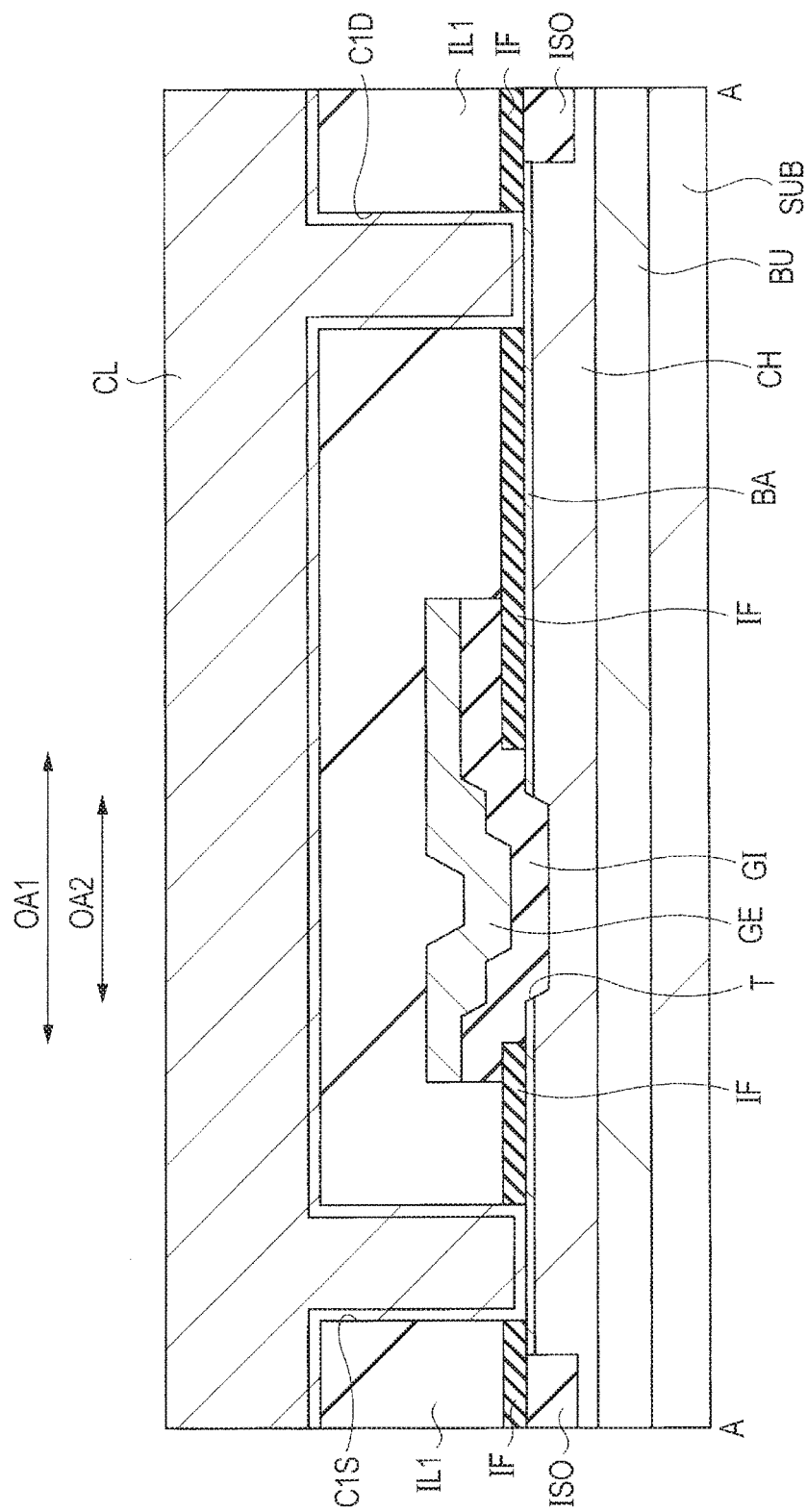
FIG. 19 is a sectional view showing a manufacturing process subsequent to FIG. 18 of a semiconductor device according to Embodiment 1.

Successively, as shown in FIG. 19, an electrically-conductive film CL is formed over the interlayer insulation film IL1 including the interiors of the contact holes C1S and C1D and others. Firstly, an ohmic layer is formed over the interlayer insulation film IL1 including the interiors of the contact holes C1S and C1D. For example, a titanium (Ti) film having a thickness of about 20 to 50 nm is deposited over the interlayer insulation film IL1 including the interiors of the contact holes C1S and C1D by a sputtering method or the like. Successively, an aluminum film having a film thickness of about 1,000 to 4,000 nm is deposited as a metallic film over the ohmic layer by a sputtering method or the like. Successively, heat treatment is applied in order to reduce the contact resistance between the barrier layer BA and the ohmic layer. For example, the heat treatment is applied for about 30 seconds at 650° C. in a nitrogen atmosphere. Here, as the metallic film, besides aluminum, an aluminum alloy may be used. As the aluminum alloy, an alloy of Al and Si (Al—Si), an alloy of Al and Cu (copper) (Al—Cu), or Al and Si and Cu (Al—Si—Cu) can be used for example.

Figure 20:
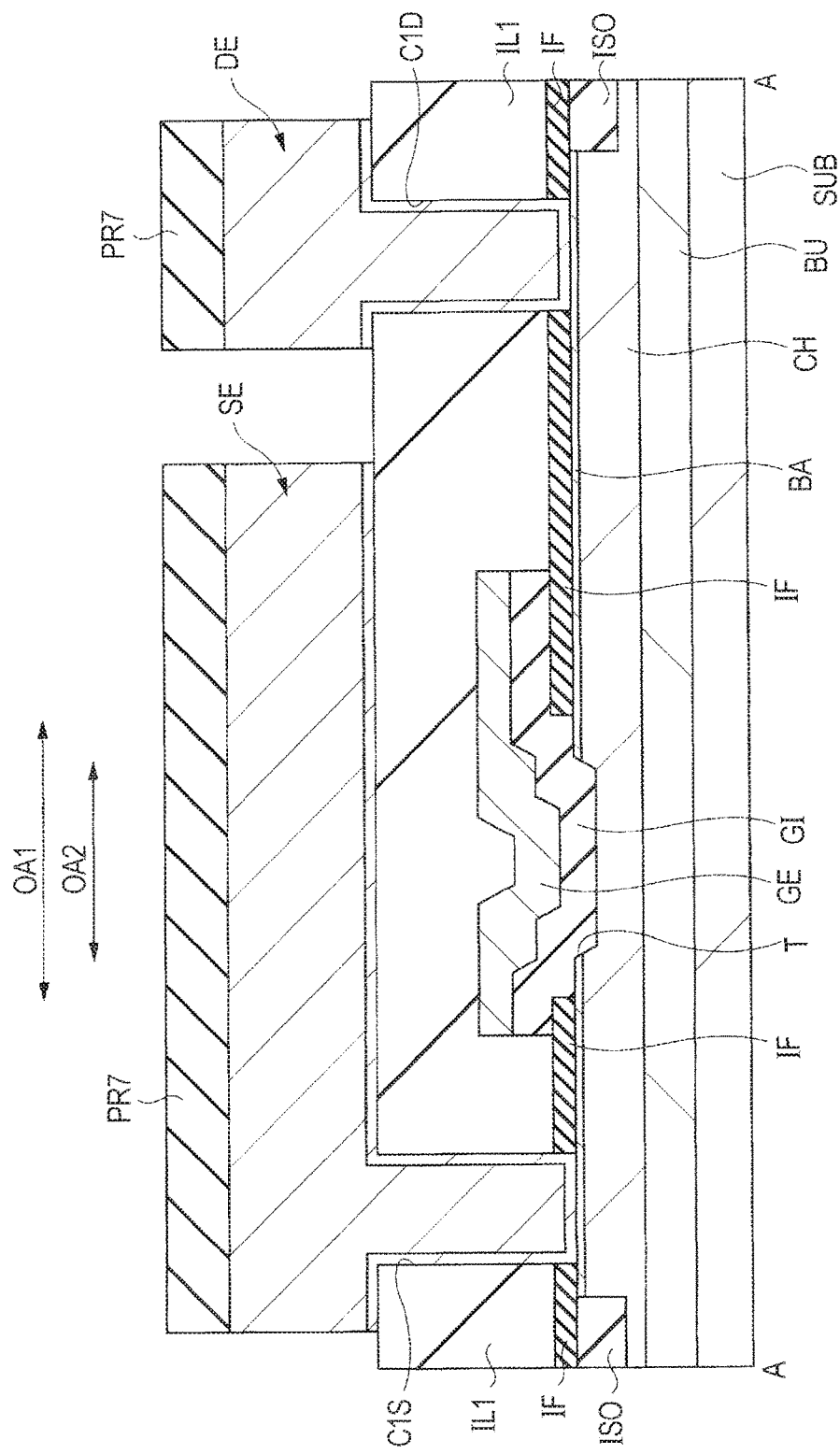
FIG. 20 is a sectional view showing a manufacturing process subsequent to FIG. 19 of a semiconductor device according to Embodiment 1.
Figure 21:
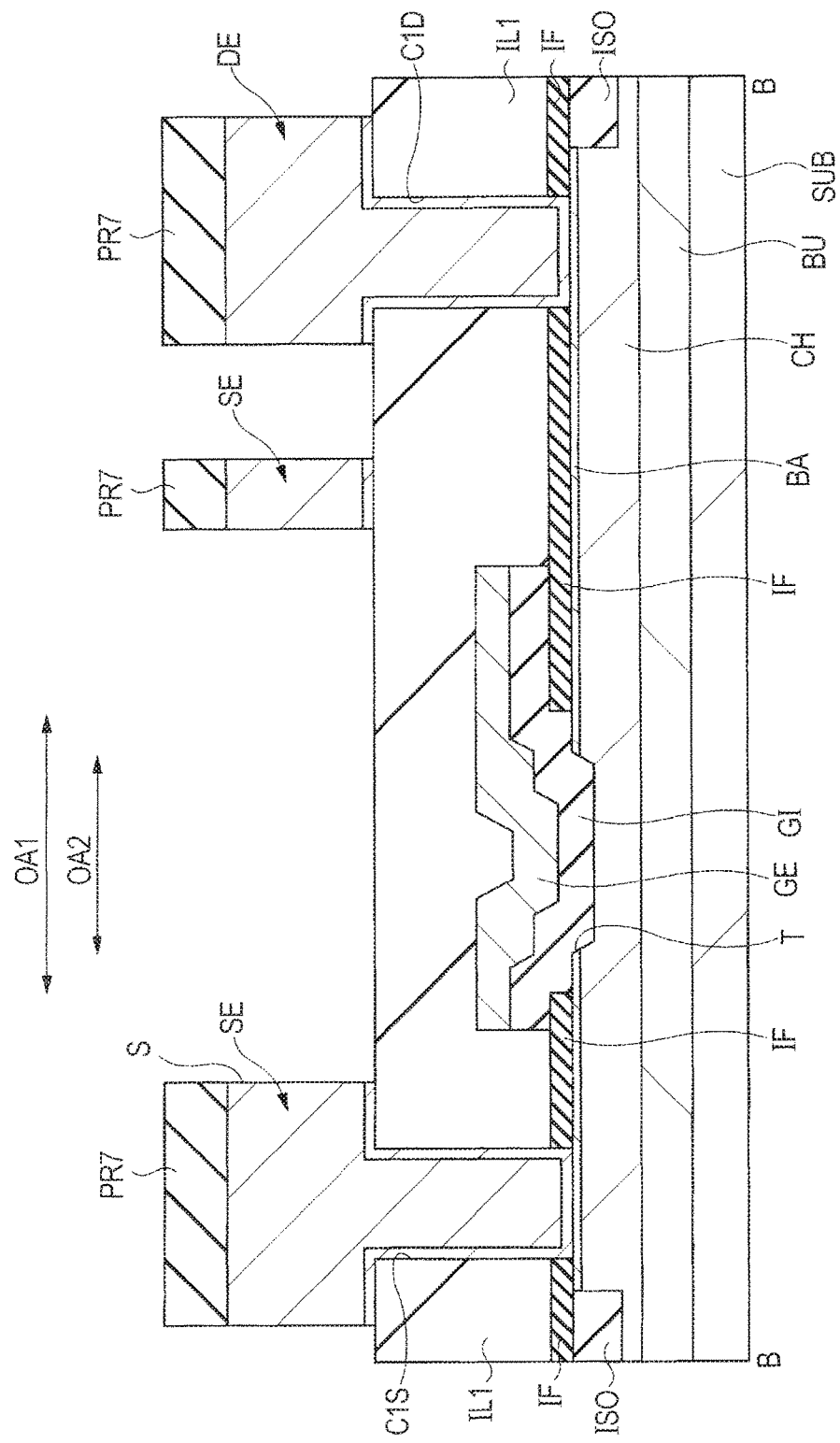
FIG. 21 is a sectional view showing a manufacturing process of a semiconductor device according to Embodiment 1.

Successively, as shown in FIGS. 20 and 21, a source electrode SE and a drain electrode DE are formed in and over the contact holes C1S and C1D by patterning the Ti/Al film by a photolithography technology and an etching technology. For example, a photoresist film PR7 to cover the region where the source electrode SE is formed and the region where the drain electrode DE is formed is formed over the electrically-conductive film CL by a photolithography technology and the electrically-conductive film CL is etched with the photoresist film PR7 used as a mask. The source electrode SE and the drain electrode DE are thereby formed. Successively the photoresist film PR7 is removed.

The source electrode SE is electrically coupled to the barrier layer BA on one side of the gate electrode GE through the contact hole C1S. The drain electrode DE is electrically coupled to the barrier layer BA on the other side of the gate electrode GE through the contact hole C1D.

Then the source electrode SE is formed so as to extend to the drain electrode DE side beyond above the gate electrode GE. The region in the source electrode SE from the position corresponding to the end of the contact hole C1S on the gate electrode GE side to the end of the source electrode SE on the drain electrode DE side is a source field plate section. The width of the source field plate section in the X direction (namely, the length of SFP in FIG. 3) is about 3 to 10 μm for example. Then a gap (opening) S is formed at the source field plate section (FIG. 21).

Successively, a protective insulation film (also referred to as a surface protective film) PRO is formed over the interlayer insulation film IL1 including over the source electrode SE and the drain electrode DE. For example, as the protective insulation film PRO, a laminated film of a silicon oxynitride film (lower layer film PROa) and a polyimide film (upper layer film PROb) is used. Firstly, the silicon oxynitride (SiON) film having a film thickness of about 900 nm is deposited over the interlayer insulation film IL1 including over the source electrode SE and the drain electrode DE by a CVD method or the like.

Successively, by etching the silicon oxynitride film (PROa) over a partial region of a wire in the same layer as the source electrode SE and the drain electrode DE (for example a pad region, not shown in the figure), the region (pad region) may be exposed. In the pad region, a source pad SP, a drain pad DP, and the like are included.

Figure 22:
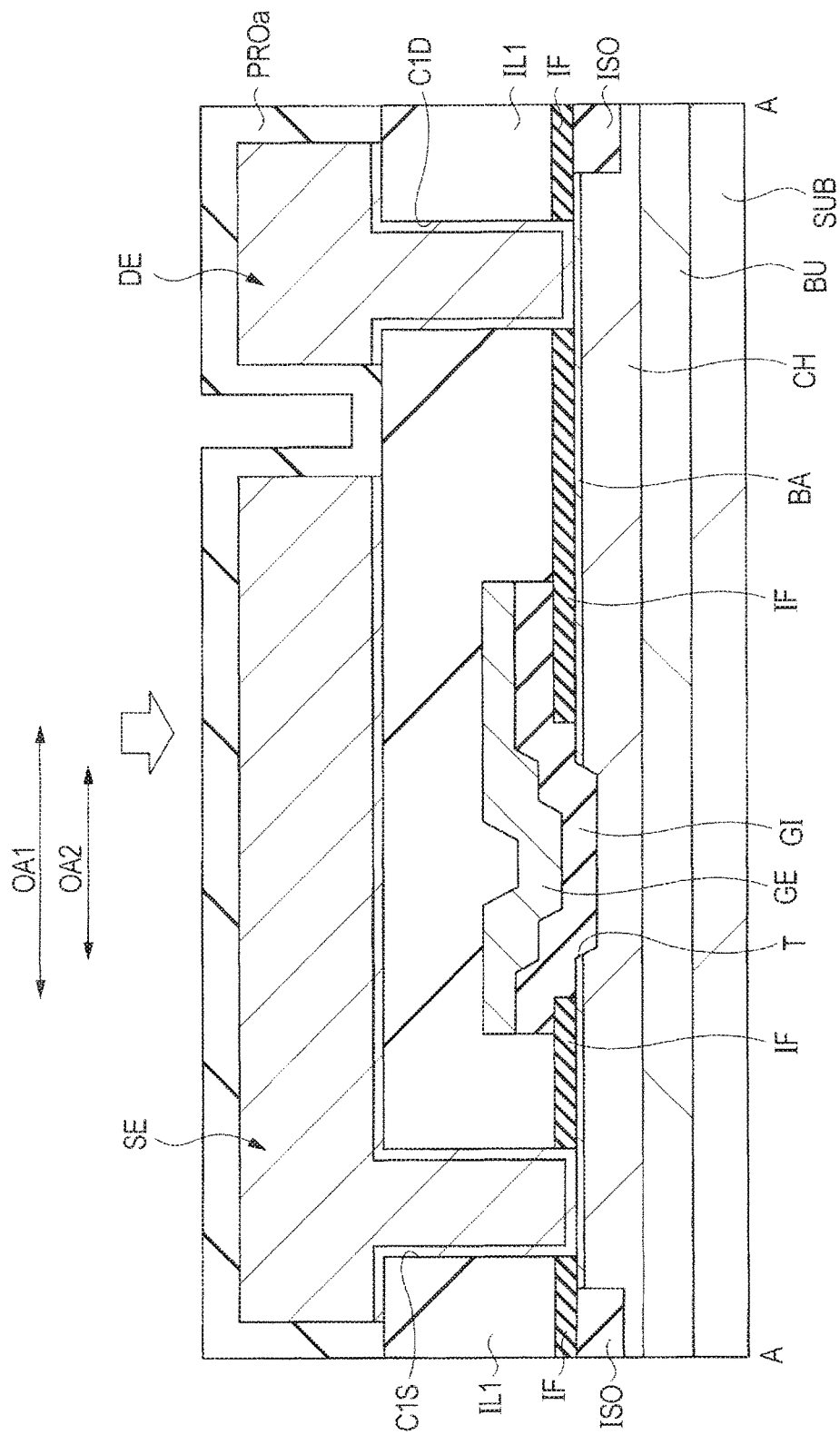
FIG. 22 is a sectional view showing a manufacturing process subsequent to FIG. 20 of a semiconductor device according to Embodiment 1.
Figure 23:
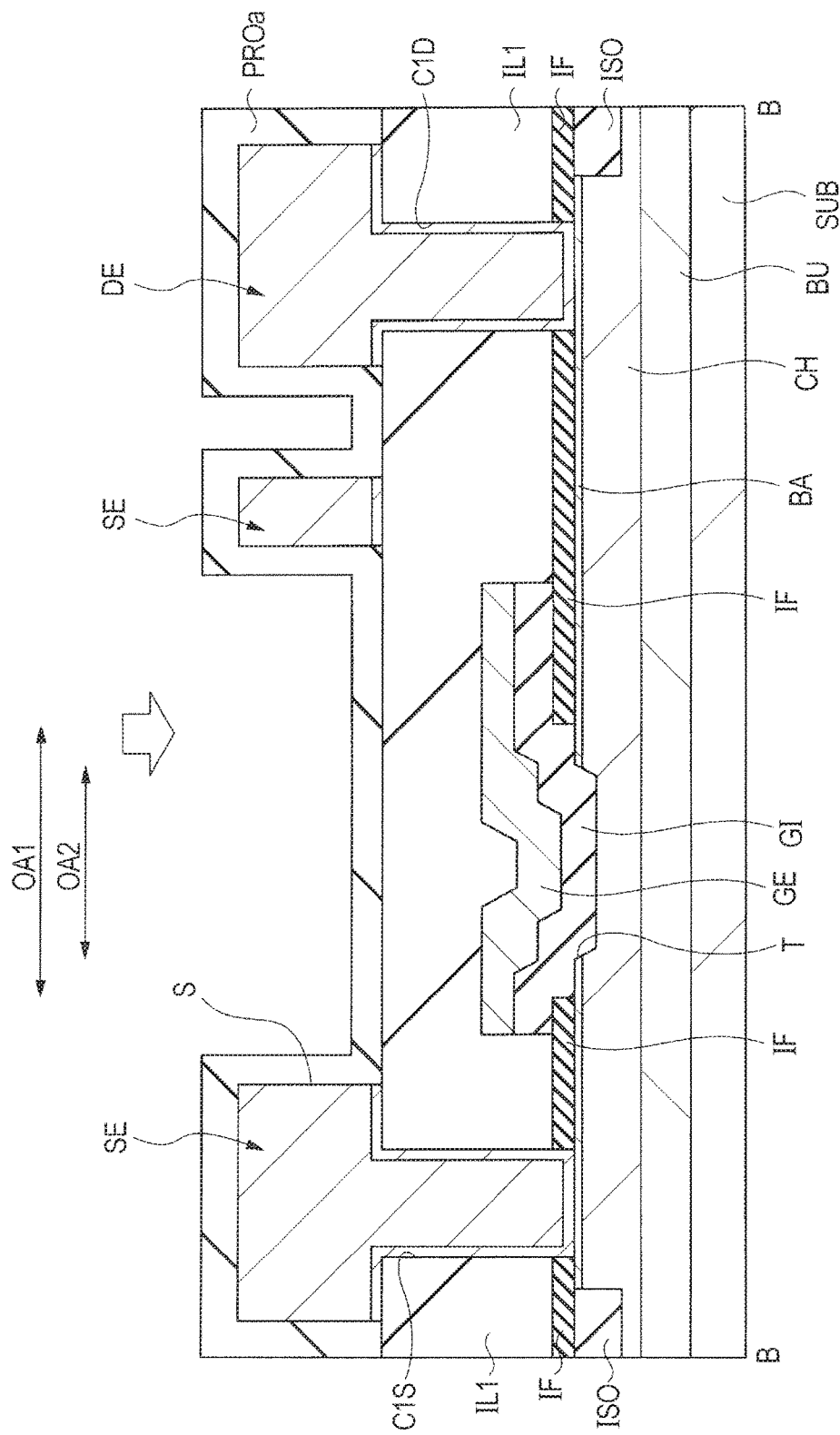
FIG. 23 is a sectional view showing a manufacturing process subsequent to FIG. 21 of a semiconductor device according to Embodiment 1.

Successively, as shown in FIGS. 22 and 23, hydrogen annealing is applied. That is, heat treatment is applied in a hydrogen atmosphere. For example, heat treatment is applied for 30 minutes or longer at 400° C. or higher in a hydrogen atmosphere in a processing room (chamber) into which a substrate SUB is carried.

Figure 24:
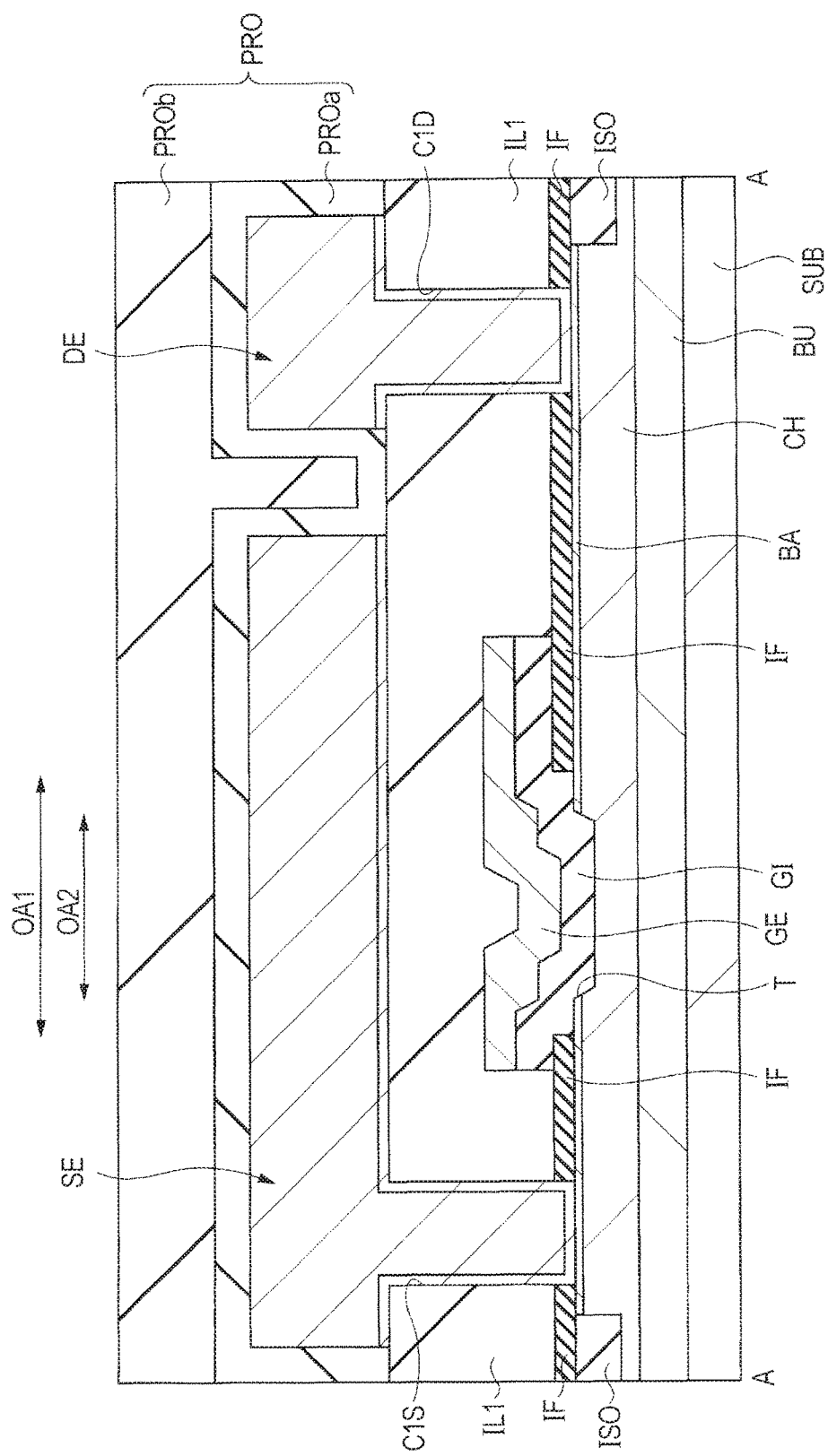
FIG. 24 is a sectional view showing a manufacturing process subsequent to FIG. 22 of a semiconductor device according to Embodiment 1.
Figure 25:
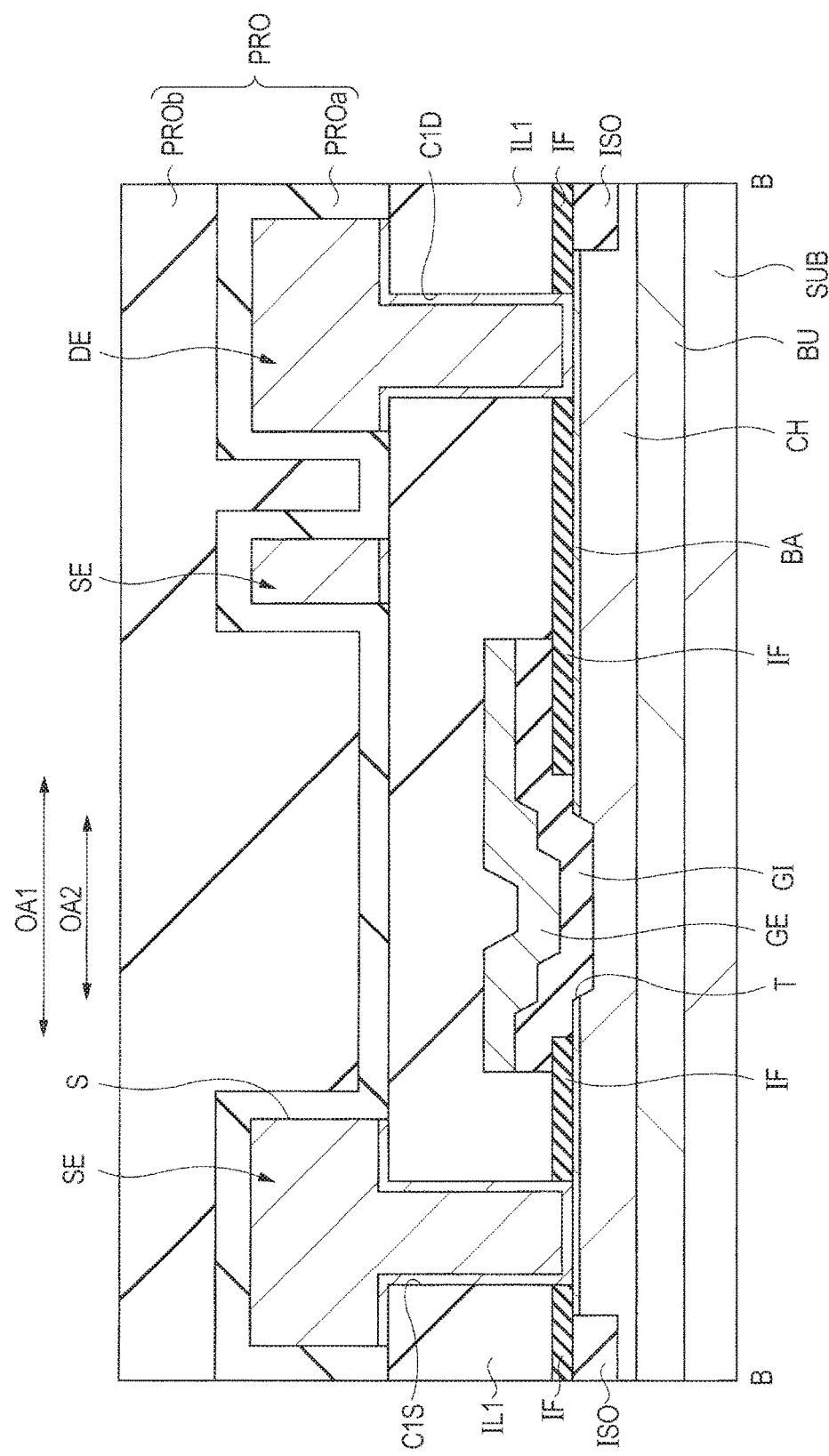
FIG. 25 is a sectional view showing a manufacturing process subsequent to FIG. 23 of a semiconductor device according to Embodiment 1.

Successively, as shown in FIGS. 24 and 25, a polyimide film (PROb) having a film thickness of about 7,000 nm is formed over the silicon oxynitride film (PROa). For example, a photosensitive polyimide film (PROb) is applied over the exposed part of a wire in the same layer as the source electrode SE and the drain electrode DE (for example the pad region, not shown in the figures) and the silicon oxynitride film (PROa). For example, the polyimide film (PROb) is formed by applying a precursor liquid of polyimide to the surface of the substrate SUB by spin-coating and then drying it. Successively, by exposing and developing the photosensitive polyimide film (PROb), the polyimide film (PROb) over the pad region and the like is removed. Successively, heat treatment is applied and the polyimide film (PROb) is hardened.

Through the process, a semiconductor device (FIGS. 1 and 2) according to the present embodiment can be formed. Here, the process is an example and a semiconductor device according to the present embodiment may be manufactured through a process other than the process.

Here, the timing of the hydrogen annealing is not limited to after the silicon oxynitride film (PROa) is formed and before the polyimide film (PROb) is formed. The polyimide film is weak against heat of 400° C. or higher however and hence, when the polyimide film (PROb) is used, the hydrogen annealing is preferably applied before the polyimide film (PROb) is formed. Further, the hydrogen annealing is preferably applied at least after the source electrode SE and the drain electrode DE are formed.

Figure 26:
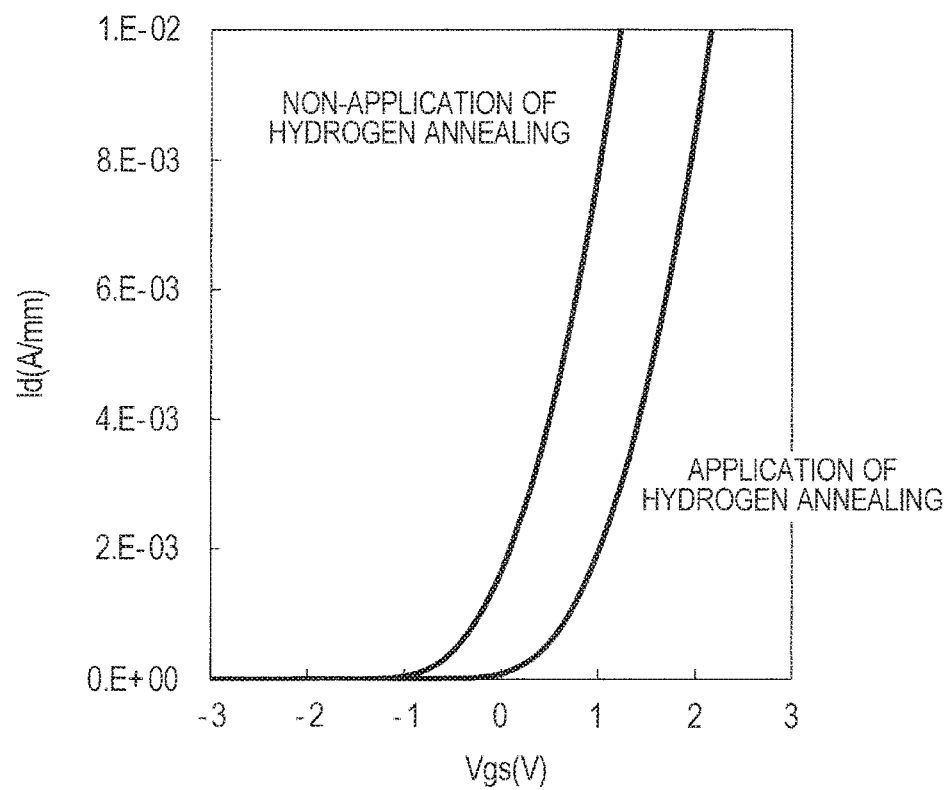
FIG. 26 is a graph showing the relationship between application/non-application of hydrogen annealing and a threshold potential.

FIG. 26 is a graph showing the relationship between application/non-application of hydrogen annealing and a threshold potential. The vertical axis represents a drain current (Id, A/mm) and the horizontal axis represents a voltage (Vgs, V) between a gate and a source. That is, FIG. 26 shows current-voltage characteristics. The case "application of hydrogen annealing" shows the current-voltage characteristic of a MIS type field-effect transistor subjected to hydrogen annealing like the present embodiment (here a gap S is not formed). The case "non-application of hydrogen annealing" shows the current-voltage characteristic of a MIS type field-effect transistor not subjected to hydrogen annealing. As shown in FIG. 26, the threshold potential tends to rise when hydrogen annealing is applied. Here, the hydrogen annealing is applied for 30 minutes at 400° C. in a hydrogen atmosphere.

In this way, it is found that the threshold potential rises by the hydrogen annealing treatment. In the case of forming a gap (opening) S at the source field plate section of the source electrode SE like the present embodiment in particular, hydrogen is supplied through the gap S and the threshold potential can rise efficiently. Further, by arranging the gap S above the gate electrode GE, it is possible to raise the threshold potential efficiently.

Further, by forming the gap S at the source field plate section of the source electrode SE into not a notched shape but an opening, the distance between the end of the source field plate section and the drain electrode DE varies less and the effect of mitigating electric field concentration increases.

Further, according to the present embodiment, since the gap S is formed at the source field plate section of the source electrode SE, it is possible to mitigate the stress added to the substrate SUB and reduce the strain of the substrate SUB. In the case of using an aluminum film (including a film containing aluminum) as the source electrode SE in particular, the substrate SUB is likely to be deformed concavely due to the stress. Further, in the case of forming the source field plate section in the source electrode SE, the region covered with the aluminum film increases and hence the problem of the stress caused by the aluminum film increases. In the present embodiment in contrast, since the gap S is formed at the source field plate section of the source electrode SE, it is possible to mitigate the stress added to the substrate SUB and reduce the strain of the substrate SUB.

Further, in the present embodiment, since the gap S is formed at the source field plate section of the source electrode SE, the area where the gate electrode GE and the source electrode SE face each other can be reduced. As a result, it is possible to reduce the capacitance between the gate electrode GE and the source electrode SE and improve the switching characteristic.

Embodiment 2

In the present embodiment, an example of forming a gap (opening) S in a source electrode SE is explained.

Although a plurality of gaps (openings) S are formed and the width W1 of each of the gaps S in the X direction is set so as to be larger than the width WT of a trench T in the X direction and the width WGE of a gate electrode GE in the X direction in Embodiment 1, the number and shape of the gaps S are not limited to those.

First Example

Figure 27:
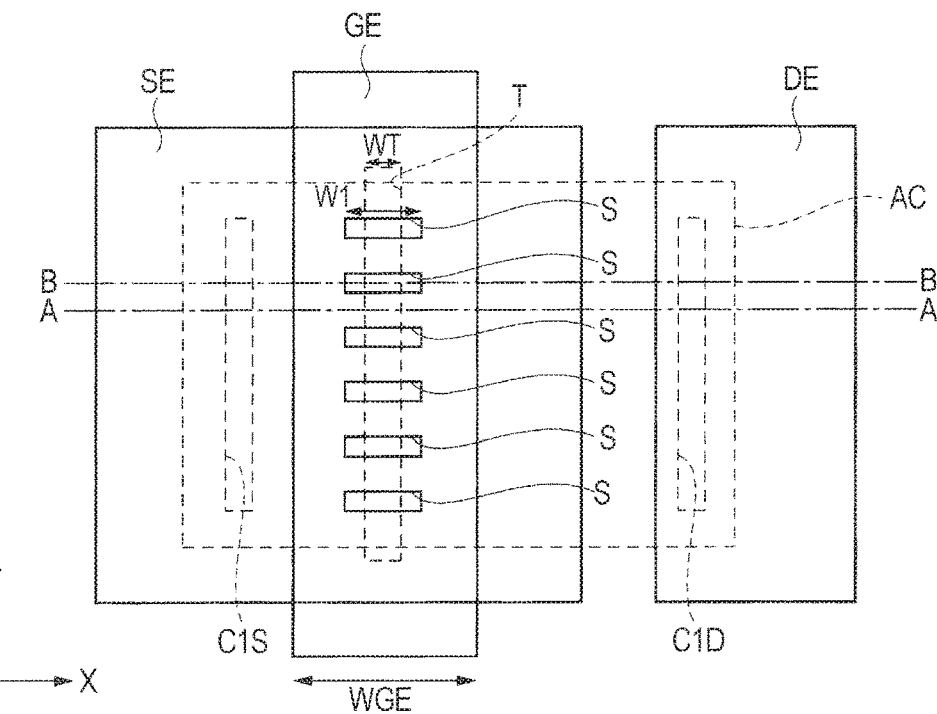
FIG. 27 is a plan view showing the configuration of a first example of a semiconductor device according to Embodiment 2.

FIG. 27 is a plan view showing the configuration of a first example of a semiconductor device according to the present embodiment. In the present example here, the configuration other than the shape of gaps (openings) S in a source electrode SE is the same as a semiconductor device according to Embodiment 1. The explanation on the structure and manufacturing process similar to Embodiment 1 therefore is avoided.

As shown in FIG. 27, in the present example, a plurality of gaps (openings) S are formed and the width W1 of each of the gaps S in the X direction is set so as to be larger than the width WT of a trench T in the X direction and smaller than the width WGE of a gate electrode GE in the X direction. The distance between the gaps S can be comparable to Embodiment 1 for example.

Second Example

Figure 28:
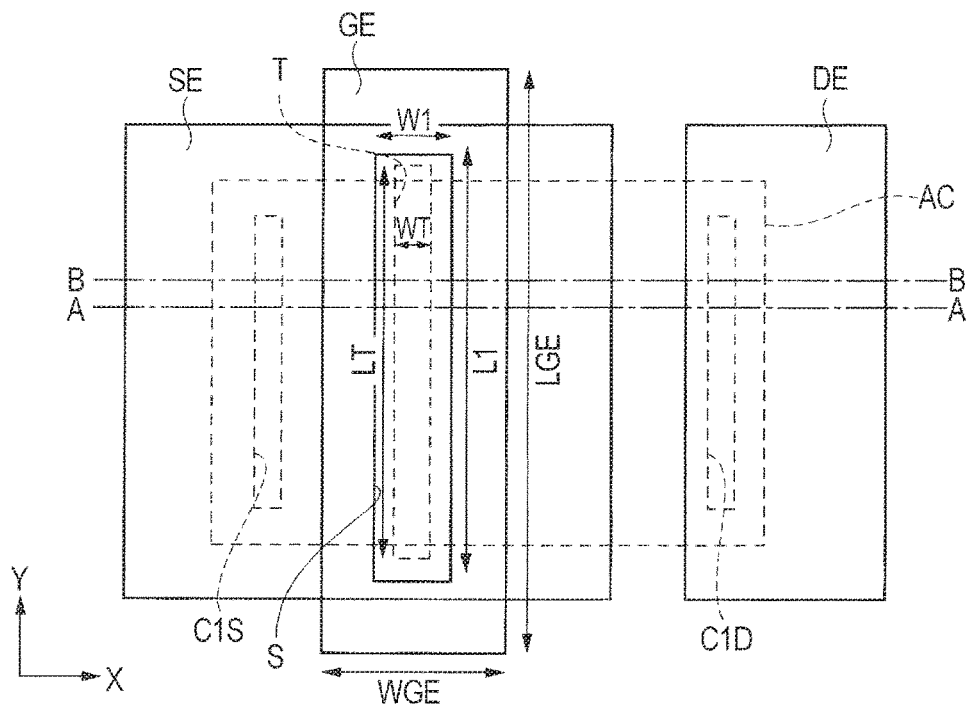
FIG. 28 is a plan view showing the configuration of a second example of a semiconductor device according to Embodiment 2.

FIG. 28 is a plan view showing the configuration of a second example of a semiconductor device according to the present embodiment. In the present example here, the configuration other than the shape of a gap (opening) S in a source electrode SE is the same as a semiconductor device according to Embodiment 1. The explanation on the structure and manufacturing process similar to Embodiment 1 therefore is avoided.

As shown in FIG. 28, a shape formed by linking a plurality of gaps (openings) S in Embodiment 1 is adopted in the present example.

Concretely, the width W1 of a gap (opening) S in the X direction is set so as to be larger than the width WT of a trench T in the X direction and smaller than the width WGE of a gate electrode GE in the X direction and the length L1 of the gap (opening) S in the Y direction is set so as to be larger than the length LT of the trench T in the Y direction. Here, LGE is the length of the gate electrode GE in the Y direction. As stated earlier, the planar shape of the gate electrode GE is one size larger than the planar shape of the trench T and they are in the relationship of LGE>LT, WGE>WT.

Other Examples

Figure 29:
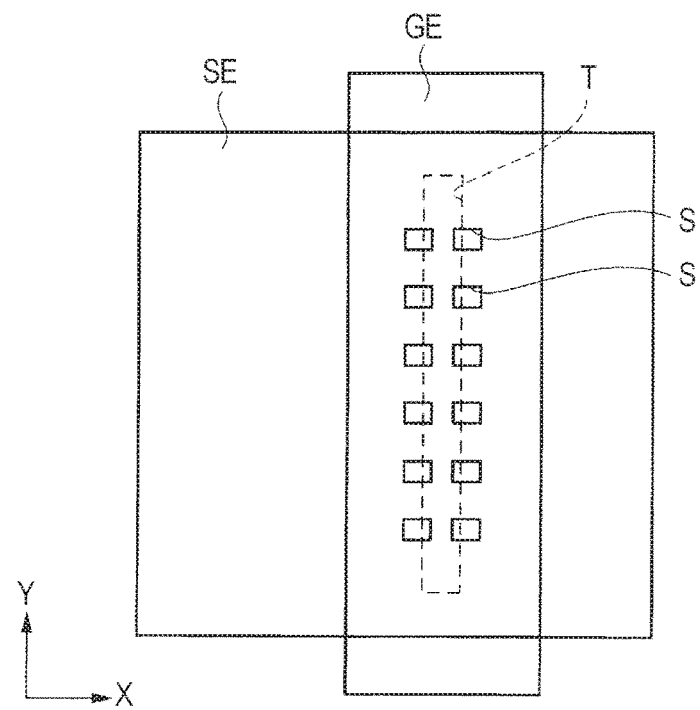
FIG. 29 is a plan view showing the configuration of another example of a semiconductor device according to Embodiment 2.
Figure 30:
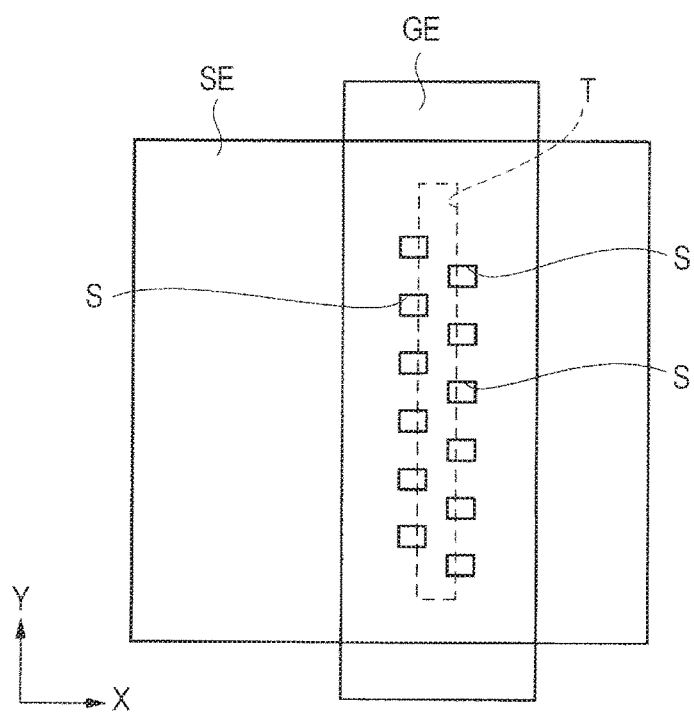
FIG. 30 is a plan view showing the configuration of another example of a semiconductor device according to Embodiment 2.

FIGS. 29 and 30 are plan views showing the configurations of other examples of a semiconductor device according to the present embodiment.

The shape of a gap (opening) S may be a square or a shape having long sides in the Y direction. Further, a plurality of gaps (openings) S may be arranged not in a row but in two rows (FIG. 29). Further, in the case of arrangement in two or more rows, the adjacent gaps (openings) S may be staggered, for example may be arranged zigzag (FIG. 30).

Although the invention established by the present inventors has heretofore been concretely explained on the bases of the embodiments, it goes without saying that the present invention is not limited to the embodiments and can be modified variously within the range not departing from the tenor of the present invention.

For example, although an insulation film IF is arranged over a barrier layer BA in Embodiment 1 (FIG. 1), it is also possible to form a cap layer between a barrier layer BA and an insulation film IF. The cap layer is a nitride semiconductor having an electron affinity larger than the barrier layer BA. As the cap layer, a gallium nitride (GaN) layer can be used for example. The GaN layer is grown heteroepitaxially by a metal organic chemical vapor deposition method or the like for example.

On this occasion, a trench T penetrating the insulation film IF, the cap layer, and the barrier layer BA and reaching the middle of a channel layer CH is formed. On this occasion further, a source electrode SE and a drain electrode DE are formed over the cap layer on both the sides of a gate electrode GE. By forming such a cap layer, it is possible to reduce the contact resistance (ohmic contact resistance) between the cap layer and the source electrode SE. Further, it is possible to reduce the contact resistance (ohmic contact resistance) between the cap layer and the drain electrode DE.

Further, although GaN is used as a channel layer CH and AlGaN is used as a barrier layer BA in Embodiment 1, they are not limited to the materials, for example InGaN may be used as the channel layer CH and AlInN or AlInGaN may be used as the barrier layer BA, and moreover when a cap layer is used, InGaN may be used as the cap layer. In this way, the combination of the materials used for the channel layer CH, the barrier layer BA, and the cap layer is arbitrarily adjustable in the range of exhibiting the functions of the layers.

What is claimed is:

1. A semiconductor device comprising:
a first nitride semiconductor layer formed above a substrate;

a second nitride semiconductor layer being formed over the first nitride semiconductor layer and having an electron affinity smaller than the first nitride semiconductor layer;

a trench penetrating the second nitride semiconductor layer and reaching the middle of the first nitride semiconductor layer;

a gate electrode being formed over the second nitride semiconductor layer with a gate insulation film interposed between the gate electrode and the second nitride semiconductor layer and the gate electrode extending in a first direction;

a first electrode coupled to the second nitride semiconductor layer on one side of the gate electrode; and a second electrode coupled to the second nitride semiconductor layer on the other side of the gate electrode, wherein the first electrode is formed above the gate electrode with a first insulation film interposed between the first electrode and the gate electrode, the first electrode extends beyond the gate electrode in a second direction intersecting with the first direction, and the first electrode has a hole, wherein the length of the hole in the first direction is larger than the length of the trench in the first direction, and wherein the width of the hole in the second direction is larger than the width of the trench in the second direction and smaller than the width of the gate electrode in the second direction.

2. A semiconductor device according to claim 1, wherein the hole is arranged above the gate electrode.

3. A semiconductor device comprising:

a first nitride semiconductor layer formed above a substrate;

a second nitride semiconductor layer being formed over the first nitride semiconductor layer and having an electron affinity smaller than the first nitride semiconductor layer;

a trench penetrating the second nitride semiconductor layer and reaching the middle of the first nitride semiconductor layer;

a gate electrode being formed over the second nitride semiconductor layer with a gate insulation film interposed between the gate electrode and the second nitride semiconductor layer and the gate electrode extending in a first direction;

a first electrode coupled to the second nitride semiconductor layer on one side of the gate electrode; and a second electrode coupled to the second nitride semiconductor layer on the other side of the gate electrode, wherein the first electrode is formed above the gate electrode with a first insulation film interposed between the first electrode and the gate electrode, the first electrode extends beyond the gate electrode in a second direction intersecting with the first direction, and the first electrode has a plurality of holes, and wherein the width of each of the plurality of holes in the second direction is larger than the width of the trench in the second direction and smaller than the width of the gate electrode in the second direction.

* * * * *